United States Patent
Zenou et al.

(10) Patent No.: US 10,629,442 B2
(45) Date of Patent: Apr. 21, 2020

(54) LIFT PRINTING OF MULTI-COMPOSITION MATERIAL STRUCTURES

(71) Applicant: Orbotech Ltd., Yavne (IL)

(72) Inventors: Michael Zenou, Hashmonaim (IL); Zvi Kotler, Tel Aviv (IL)

(73) Assignee: Orbotech Ltd., Yavne (IL)

( * ) Notice: Subject to any disclaimer, the term of this patent is extended or adjusted under 35 U.S.C. 154(b) by 0 days.

(21) Appl. No.: 15/024,674

(22) PCT Filed: Oct. 7, 2014

(86) PCT No.: PCT/IL2014/000050
§ 371 (c)(1),
(2) Date: Mar. 24, 2016

(87) PCT Pub. No.: WO2015/056253
PCT Pub. Date: Apr. 23, 2015

(65) Prior Publication Data
US 2016/0233089 A1 Aug. 11, 2016

Related U.S. Application Data

(60) Provisional application No. 61/890,346, filed on Oct. 14, 2013.

(51) Int. Cl.
*C23C 14/32* (2006.01)
*H01L 21/268* (2006.01)
(Continued)

(52) U.S. Cl.
CPC ........... *H01L 21/268* (2013.01); *B41M 5/025* (2013.01); *C23C 26/02* (2013.01); *H01G 7/021* (2013.01);
(Continued)

(58) Field of Classification Search
CPC .............. C23C 26/02; H01L 21/02623; H01L 21/02625; H01L 21/268; H01L 21/2683;
(Continued)

(56) References Cited

U.S. PATENT DOCUMENTS

| | | |
|---|---|---|
| 4,752,455 A | 6/1988 | Mayer |
| 4,895,735 A | 1/1990 | Cook |

(Continued)

FOREIGN PATENT DOCUMENTS

| | | | |
|---|---|---|---|
| CN | 103069043 A | | 4/2013 |
| DE | 10237732 A1 | * | 3/2004 |

(Continued)

OTHER PUBLICATIONS

Webster's Ninth New Collegiate Dictionary; Merriam-Webster Inc. publishers; Springfield, Massachusetts, USA; 1990 (no month); excerpt p. 186, & 1005.*

(Continued)

*Primary Examiner* — Marianne L Padgett
(74) *Attorney, Agent, or Firm* — Sughrue Mion, PLLC

(57) ABSTRACT

A method for material deposition includes providing a transparent donor substrate (56, 60) having opposing first and second surfaces and multiple donor films (62, 64) including different, respective materials on the second surface. The donor substrate is positioned in proximity to an acceptor substrate (41), with the second surface facing toward the acceptor substrate. Pulses of laser radiation are directed to pass through the first surface of the donor substrate and impinge on the donor films so as to induce ejection of molten droplets containing a bulk mixture of the different materials from the donor films onto the acceptor substrate.

29 Claims, 18 Drawing Sheets

(51) Int. Cl.

| | | |
|---|---|---|
| *H05K 3/12* | (2006.01) | |
| *H05K 3/22* | (2006.01) | |
| *C23C 26/02* | (2006.01) | |
| *B41M 5/025* | (2006.01) | |
| *H01G 7/02* | (2006.01) | |
| *H01L 21/02* | (2006.01) | |
| H01L 21/288 | (2006.01) | |
| B33Y 10/00 | (2015.01) | |
| B33Y 30/00 | (2015.01) | |

(52) U.S. Cl.
CPC ....... *H01G 7/026* (2013.01); *H01L 21/02601* (2013.01); *H01L 21/02612* (2013.01); *H05K 3/1241* (2013.01); *H05K 3/225* (2013.01); *B33Y 10/00* (2014.12); *B33Y 30/00* (2014.12); *B41M 2205/08* (2013.01); *H01L 21/288* (2013.01)

(58) Field of Classification Search
CPC .. H01L 21/2686; H01L 21/288; B41M 5/025; B41M 5/0256; B41M 2205/08; B33Y 10/00
USPC ................................ 427/561, 586, 596, 597
See application file for complete search history.

(56) References Cited

U.S. PATENT DOCUMENTS

| | | | |
|---|---|---|---|
| 4,970,196 A | 11/1990 | Kim et al. | |
| 4,977,038 A | 12/1990 | Sieradzki et al. | |
| 4,987,006 A * | 1/1991 | Williams ................ | B41M 5/24 427/123 |
| 5,308,737 A | 5/1994 | Bills et al. | |
| 5,725,914 A | 3/1998 | Opower | |
| 6,159,832 A | 12/2000 | Mayer | |
| 6,177,151 B1 | 1/2001 | Chrisey et al. | |
| 6,440,503 B1 | 8/2002 | Merdan et al. | |
| 7,294,367 B2 * | 11/2007 | Barron ................... | A61B 18/20 427/595 |
| 7,875,324 B2 * | 1/2011 | Barron ................... | A61B 18/20 427/595 |
| 7,942,987 B2 | 5/2011 | Crump et al. | |
| 8,101,247 B2 * | 1/2012 | Ringeisen ............ | B23K 26/009 427/596 |
| 8,215,371 B2 | 7/2012 | Batchelder | |
| 8,216,931 B2 | 7/2012 | Zhang | |
| 8,262,916 B1 | 9/2012 | Smalley et al. | |
| 9,027,378 B2 | 5/2015 | Crump et al. | |
| 10,144,034 B2 * | 12/2018 | Zenou ................... | G02B 6/3598 |
| 10,193,004 B2 * | 1/2019 | Zenou ................. | H01L 21/4846 |
| 10,471,538 B2 * | 11/2019 | Zenou ................... | B23K 26/34 |
| 2006/0076584 A1 * | 4/2006 | Kim ................... | H01L 21/2007 257/275 |
| 2007/0203584 A1 | 8/2007 | Bandyopadhyay et al. | |
| 2007/0274028 A1 | 11/2007 | Hsu et al. | |
| 2008/0006966 A1 | 1/2008 | Mannella | |
| 2008/0038487 A1 * | 2/2008 | Barron ................... | A61B 18/20 427/596 |
| 2008/0041725 A1 | 2/2008 | Klein et al. | |
| 2009/0130427 A1 | 5/2009 | Grigoropoulos et al. | |
| 2010/0021638 A1 | 1/2010 | Varanka et al. | |
| 2011/0278269 A1 | 11/2011 | Gold et al. | |
| 2012/0025182 A1 | 2/2012 | Umeda et al. | |
| 2012/0080088 A1 | 4/2012 | Grabitz et al. | |
| 2013/0011562 A1 | 1/2013 | Varanka et al. | |
| 2013/0037838 A1 * | 2/2013 | Speier ................. | H01L 51/5036 257/98 |
| 2013/0176699 A1 | 7/2013 | Tonchev et al. | |
| 2013/0302154 A1 | 11/2013 | Finlayson | |
| 2014/0097277 A1 | 4/2014 | Kumta et al. | |
| 2014/0160452 A1 | 6/2014 | De Jager et al. | |
| 2015/0001093 A1 | 1/2015 | Carter et al. | |
| 2015/0197862 A1 | 7/2015 | Engel et al. | |
| 2015/0203984 A1 | 7/2015 | Zhang et al. | |
| 2015/0239274 A1 | 8/2015 | Batt | |
| 2015/0294872 A1 | 10/2015 | Molpeceres Alvarez et al. | |
| 2016/0259250 A1 * | 9/2016 | Hendriks .............. | G03F 7/2008 |
| 2017/0189995 A1 * | 7/2017 | Zenou ................... | B23K 26/34 |
| 2017/0210142 A1 * | 7/2017 | Kotler .................... | B41J 2/455 |
| 2017/0250294 A1 | 8/2017 | Zenou et al. | |
| 2017/0320263 A1 * | 11/2017 | Guillemot ........... | B41J 2/14104 |
| 2017/0365484 A1 * | 12/2017 | Kotler ................. | H01L 21/3063 |
| 2018/0015671 A1 * | 1/2018 | Sandstrom ............ | C23C 14/048 |
| 2018/0281243 A1 * | 10/2018 | Zenou ...................... | B22C 9/00 |
| 2019/0302655 A1 * | 10/2019 | Landa ................... | C08G 77/04 |

FOREIGN PATENT DOCUMENTS

| | | | |
|---|---|---|---|
| DE | 102012003866 B4 | 7/2013 | |
| EP | 002299784 A1 * | 3/2011 | |
| EP | 3058113 A1 | 4/2015 | |
| EP | 3166143 A1 | 5/2017 | |
| GB | 2453774 A | 4/2009 | |
| JP | 61-260603 A | 11/1986 | |
| JP | 4-269801 A | 9/1992 | |
| JP | 6-34283 A | 2/1994 | |
| JP | 11-337227 A | 12/1999 | |
| JP | 2003524074 A | 8/2003 | |
| JP | 2012-519390 A | 8/2012 | |
| TW | 200744413 A | 12/2007 | |
| TW | 201105194 A1 | 2/2011 | |
| WO | 2009062754 A1 | 5/2009 | |
| WO | WO 2009/081355 A2 * | 7/2009 | |
| WO | WO 2009/153792 A2 * | 12/2009 | |
| WO | 2010/100635 A1 | 9/2010 | |
| WO | 2010113357 A1 | 10/2010 | |
| WO | 2012/066338 A2 | 5/2012 | |
| WO | 2013/037838 A1 | 3/2013 | |
| WO | 2013/080030 A1 | 6/2013 | |
| WO | 2013/124254 A1 | 8/2013 | |
| WO | WO 2013/165241 A1 * | 11/2013 | |
| WO | 2015/056253 A1 | 4/2015 | |
| WO | 2015/181810 A1 | 12/2015 | |
| WO | 2016/063270 A1 | 4/2016 | |
| WO | 2016/124712 A2 | 8/2016 | |
| WO | 2017/006306 A1 | 1/2017 | |

OTHER PUBLICATIONS

Richard J Lewis, Sr. editor; Hawley's Condensed Chemical Dictionary, 12th edition; Van Nostrand Reinhold company, New York; 1993 (no month); excerpt p. 304.*
Written Opinion of the International Searching Authority of PCT/IL2014/000050 dated Feb. 10, 2015.
International Search Report of PCT/IL2014/000050 dated Feb. 10, 2015.
International Preliminary Report on Patentability for PCT/IL2014/000050 dated Apr. 28, 2016.
Communication dated May 31, 2017, from the State Intellectual Property Office of the P.R.C., in counterpart Chinese application No. 201480054603.8.
Communication dated Jul. 7, 2017, issued from the European Patent Office in corresponding Application No. 14853486.0.
Willis et al., "The effect of melting-induced volumetric expansion on initiation of laser-induced forward transfer," Applied Surface Science, 2007, vol. 253; publ. online Dec. 1, 2006, p. 4759-4763.
Nagel et al., "Laser-Induced Forward Transfer for the Fabrication of Devices," Nanomaterials: Laser-Induced Nano/Microfabrications, p. 255-316, 2012 (no month); first edition.
Adrian et al., A study of the mechanism of metal deposition by the laser-induced forward transfer process, Journal of Vacuum Science & Technology B, vol. 5, No. 5, Sep./Oct. 1987, p. 1490-1494 (6 pages total), 1/2 illegible.
Tan et al., "Selective surface texturing using femtosecond pulsed laser induced forward transfer," Applied Surface Science, 2003, vol. 207, p. 365-371.
Bohandy et al., "Metal deposition from a supported metal film using an excimer laser," Journal of Applied Physics, vol. 60, No. 4, 1986, p. 1538-1539, Aug. 15, 1986.

(56) References Cited

OTHER PUBLICATIONS

Hecht, "Multifrequency Acoustooptic Diffraction," IEEE Transactions on Sonics and Ultrasonics, vol. SU-24, No. 1, Jan. 1977, p. 7-18.
Piqué, "Laser Transfer Techniques for Digital Microfabrication," 2010, p. 259-291, chpt. 11; Springer Series in Mat. Sci. #135.
Antonov et al., "Efficient Multiple-Beam Bragg Acoustooptic Diffraction with Phase Optimization of a Multifrequency Acoustic Wave," Technical Physics, 2007, vol. 52, No. 8, p. 1053-1060.
Wang et al., "Silicon solar cells based on all-laser-transferred contacts," Prog. Photovolt: Res. Appl. 2015; vol. 23, p. 61-68.
Taiwanese Search Report dated Feb. 21, 2018 in application 103143716.
Fardel et al., "Laser-Induced Forward Transfer of Organic LED Building Blocks Studied by Time-Resolved Shadowgraphy," J. Phys. Chem. C, 2010, vol. 114, No. 2, p. 5617-5636, Online Jan. 6, 2010.
Alberto Pique (2011). Rapid Prototyping of Embedded Microelectronics by Laser Direct-Write, Rapid Prototyping Technology—Principles and Functional Requirements, Dr. M. Hogue (Ed.), ISBN: 978-953-307-970-7, InTech, Available from: www.intechopen.com/books/rapid-prototyping-technology-principles-andfunctional-requirements/rapid-prototyping-of-embedded-microelectronics-by-laser-direct-write, Chapter 12; pp. 247-272+ abstract, Sep. 2011.
"Direct Digital Electrical Interconnecting of Active and Passive elements on Flexible Foils," The Discovery Dispatch, Search Report Docket: 3896, Jan. 23, 2017, p. 1-8, No author.
International Search Report dated Sep. 12, 2014 in application No. PCT/BR2014/000215.
International Search Report and Written Opinion dated Sep. 9, 2015 in application No. PCT/IL2015/000027.
"Printing of Molded 3D Micro-Structures" The Discovery Dispatch, Search Report Docket: 3815, Jul. 17, 2015, p. 1-9, No author.
International Search Report and Written Opinion dated Jan. 29, 2017 in application No. PCT/IL2016/051180.
"Complex 3D Metal Structures Printed Using a Sacrificial Metal Support" The Discovery Dispatch, Search Report Docket: 3812, Dec. 8, 2015, p. 1-9, No author.
International Search Report and Written Opinion dated May 2, 2016 in application No. PCT/IL2016/050037.
Communication dated Jan. 2, 2018 from the European Patent Office in application No. 16739878.3.
"A Method for Printing Multi-Composition Materials by Self Alloying" The Discovery Dispatch, Search Reporting Docket: 3811, Feb. 5, 2014, p. 1-7, No author.
International Search Report and Written Opinion dated Feb. 10, 2015 in application No. PCT/IL2014/000050.
Supplemental Partial European Search Report dated Nov. 9, 2016 in application No. 14751180.
Communication dated Jul. 7, 2017 from the European Patent Office in application No. 14853486.0.
Communication dated Oct. 18, 2017 from the Taiwan Intellectual Property Office in application No. 10621046690.
U.S. Patent and Trademark Office U.S. Appl. No. 15/509,491.
Willis et al., "Microdroplet deposition by laser-induced forward transfer," Applied Physics Letters 86, 244103, 2005. (3 pages total).
Piqué et al., "Laser Forward Transfer of Electronic and Power Generating Materials," Laser Ablation and its Applications, pp. 339-373 (35 pages total), Jan. 2007, vol. 129 of Springer Series in Optical Sciences.
Mohammad Vaezi et al. , "A Review on 3D Micro-Additive Manufacturing Technologies", The International Journal of Advanced Manufacturing Technology, vol. 67, No. 5-8, Jul. 1, 2013, pp. 1721-1754.
European Search Report issued in Application PCT/IL2016050037 dated Jan. 2, 2018.
Communication dated May 11, 2018 from the European Patent Office in counterpart European application No. 15852999.0.
Biver, E., et al., "Multi-jets formation using laser forward transfer", Applied Surface Science, vol. 302, 2014, pp. 153-158, XP028835206, Available online Oct. 18, 2013.
Communication dated May 2, 2018 from the State Intellectual Property Office of the People's Republic of China in application No. 201480054603.8.
Ji-Hua Zhang, "Functional Material and Application Thereof", China Machine Press, Jan. 2009, ISBN: 9787111254805; pp. 86-87.
Wang et al., "Silicon solar cells based on all-laser-transferred contacts", Progress in Photovoltaics: Research and Applications, Appl. 2015; vol. 23, pp. 61-68, Published online Jul. 19, 2013.
Nagel et al., "Laser-Induced Forward Transfer for the Fabrication of Devices", Applied physics A materials science & processing, Jan. 1, 2012, pp. 255-316.
Piqué et al., "Laser Direct-Write of Embedded Electronic Components and Circuits", Photon Processing in Microelectronics and Photonics IV, vol. 5713, International Society for Optics and Photonics, pp. 223-231, cited reference 2003.
International Search Report and Written Opinion dated Jul. 30, 2018 in application No. PCT/IL2018/050455.
Barnett, "3D Printing: Integrating Electronics-Digital Fabrication", ://dfabclass.com/17r/3dprinting-integrating-electronics/, Feb. 4, 2017, 7 pages.
Nagel et al.; the bottom of the first page of the article (p. 255) & the top of p. 256, appear to indicate this is part of Chapter 5, "Nano material: laser-induced Nano/Micro fabrications", which is part of a book titled "Nanomaterials: processing and characterization with laser"; 1st edition; S.C. Singh et al., editors; published 2012 by Wiley-VCH Verlag GmbH & Co.
Komorita, et al., "Oxidation state control of micro metal-oxide patterns produced by using laser-induced forward transfer technique," Proceedings of SPIE vol. 4830, Third International Symposium on Laser Precision Microfabrication, Feb. 19, 2003 (6 pages total).
An Office Action dated Feb. 26, 2019, which issued during the prosecution of U.S. Appl. No. 15/313,569.
Pique, et al., "A novel laser transfer process for direct writing of electronic and sensor materials", Applied Physics A, 1999, vol. 69, pp. S279-S284 (6 pages total).
Communication dated Apr. 2, 2019 from Japanese Patent Office in counterpart JP Application No. 2016-568049.
Phipps, C., "Laser Ablation and its Applications", Springer, 2007, Figure 2 [p. 345], pp. 341, 344, 345, and 361 (7 pages), Also cover, intro page chapter 14+ p. 367.
Communication dated Sep. 12, 2019 from the Taiwanese Patent Office in application No. 104116705, One page Search report in English.
Communication dated Aug. 14, 2019, from the State Intellectual Property Office of People's Republic of China in counterpart Application No. 201680005719.1.
S.K. Janikowski, et al., "Noncyanide Stripper Placement Program", Enstrip C-38, Air Force Engineering & Services Center AFESC, May 1989, pp. 110-114 (6 pages total).
Baseman et al., "Laser Induced Forward Transfer", Materials Research Society Symposia Proceedings, 1988, vol. 101, pp. 237-242 (9 pages).
Z. Toth et al., "Laser-induced compound formation and transfer of stacked elemental layers", Thin Solid Films, 1994, vol. 245, pp. 40-43 (5 pages).
Communication dated Nov. 1, 2018, from Japanese Patent Office in counterpart application No. 2016-520158, Untranslated.

* cited by examiner

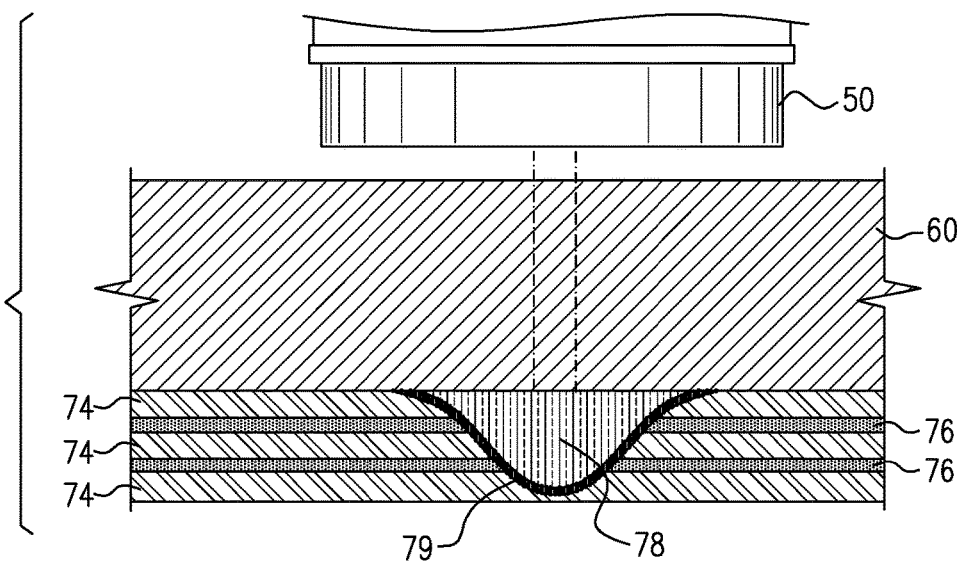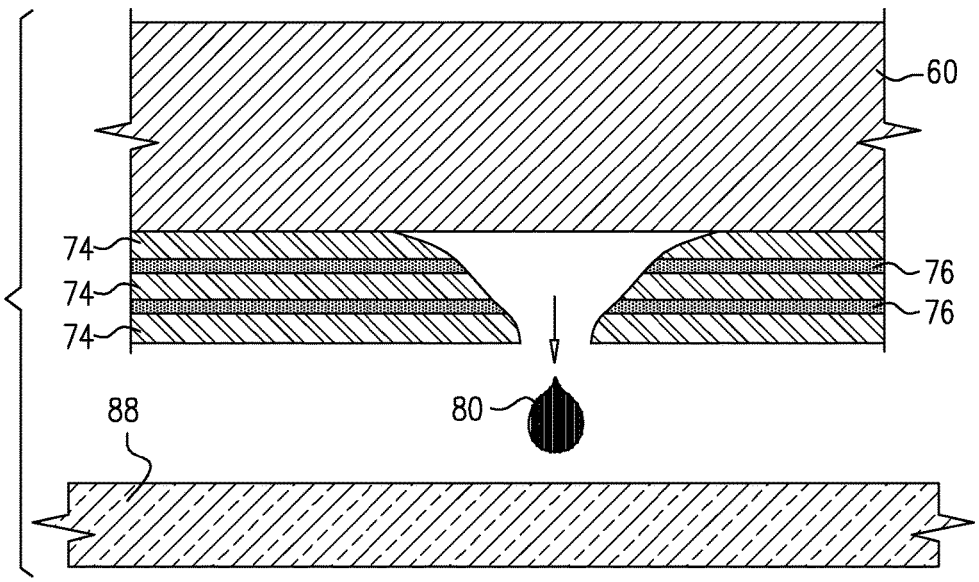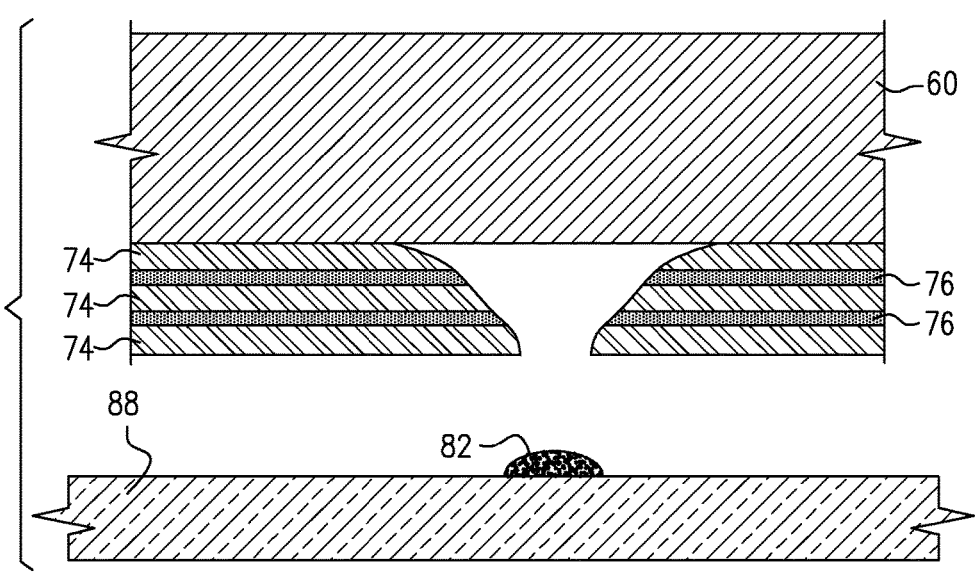

LIFT PRINTING OF MULTI-COMPOSITION MATERIAL STRUCTURES

CROSS-REFERENCE TO RELATED APPLICATIONS

This application is a National Stage of International Application No. PCT/IL2014/000050, filed Oct. 7, 2014, and claims the benefit of U.S. Provisional Patent Application 61/890,346, filed Oct. 14, 2013, whose disclosure is incorporated herein by reference.

FIELD OF THE INVENTION

The present invention relates generally to laser direct writing, and particularly to methods and systems for printing multi-composition material structures using Laser Induced Forward Transfer.

BACKGROUND OF THE INVENTION

Laser-Induced Forward Transfer (LIFT) technology offers an attractive cost/performance ratio for manufacturing and repair of Printed Circuit Boards (PCBs), Integrated Circuits (IC) substrates, Flat Panel Displays (FPDs) and other electronic devices. In the LIFT process the laser photons are used as the triggering driving force to eject a small volume of material from a source film (known as "donor") toward an acceptor substrate (known as "acceptor" or "receiver").

U.S. Pat. No. 4,970,196, whose disclosure is incorporated herein by reference, describes a method and apparatus for thin film deposition of materials with a high power pulsed laser. The invention accomplishes the laser direct writing of materials by positioning a receiving substrate opposite a high power pulsed laser source and disposing therebetween an optically transparent source support substrate having coated on one side a thin film of material. The thin film of material can also be a plurality of layers of different types of material. For example, a three layer film can have one layer of gold, a second layer of copper and a third layer of silver.

U.S. Pat. No. 6,440,503, whose disclosure is incorporated herein by reference, describes laser deposition of elements onto medical devices. In one method, a sacrificial layer does not decompose at high temperature and does not chemically interact with the material of a projectile layer. However, embodiments of the present method have been envisioned in which the sacrificial layer and the projectile layer do interact chemically. For example, in one method, a layer of nickel and a layer of titanium are utilized and the material which is deposited on the work piece is a nickel titanium alloy.

SUMMARY OF THE INVENTION

An embodiment of the present invention that is described herein provides a method for material deposition including providing a transparent donor substrate having opposing first and second surfaces and multiple donor films including different, respective materials on the second surface. The donor substrate is positioned in proximity to an acceptor substrate, with the second surface facing toward the acceptor substrate. Pulses of laser radiation are directed to pass through the first surface of the donor substrate and impinge on the donor films so as to induce ejection of molten droplets containing a bulk mixture of the different materials from the donor films onto the acceptor substrate.

There is additionally provided, in accordance with an embodiment of the present invention, a method for material deposition including providing a transparent donor substrate having opposing first and second surfaces and multiple donor films in a non-uniform distribution on the second surface. The donor substrate is positioned in proximity to an acceptor substrate, with the second surface facing toward the acceptor substrate. Pulses of laser radiation are directed to pass through the first surface of the donor substrate and impinge on the donor films at a location selected responsively to the non-uniform distribution, so as to induce ejection of droplets of molten material from the donor films onto the acceptor substrate.

In some embodiments, the donor films include at least first and second films, which respectively include different, first and second components, whereby the molten material includes a combination of the first and second components, and directing the pulses includes selecting the location so as to control relative proportions of the first and second components in the molten material. In other embodiments, at least one of the multiple donor films has a thickness that varies over the second surface. In yet other embodiments, the multiple donor films include at least first and second films that are interleaved transversely across the second surface.

In an embodiment, at least two of the donor films are of different structures. In another embodiment, at least two of the donor films are of different material compositions. In yet another embodiment, at least two of the donor films are of different thicknesses.

In some embodiments, at least two of the donor films are of different morphological structures. In other embodiments, the method includes controlling an amount of laser energy absorbed in the donor films by choosing an order of the multiple donor films on the donor substrate. In yet other embodiments, the method includes controlling a deposition rate of the molten material on the acceptor substrate by choosing an order of the multiple donor films on the donor substrate.

In an embodiment, at least one of the donor films includes a composite matrix. In another embodiment, the method includes electrically charging at least one of the donor films so as to form electrets on the acceptor. In yet another embodiment, the method includes forming at least one amorphous layer of the molten material on the acceptor substrate by controlling a temperature of the droplets.

In some embodiments, the method includes forming a hybrid structure of a crystalline material and an amorphous material across the acceptor, by controlling a temperature of the droplets. In other embodiments, the donor films include at least a semiconductor material and a dielectric material, and directing the pulses of the laser radiation includes forming on the acceptor substrate a quantum dot including the semiconductor material and the dielectric material.

There is additionally provided, in accordance with an embodiment of the present invention, a method for material deposition including specifying a composition of a compound material to be deposited on an acceptor substrate. A transparent donor substrate is provided. The donor substrate has opposing first and second surfaces and multiple donor films including different, respective components of the specified composition formed on the second surface and having respective layer thicknesses selected responsively to the specified composition. The donor substrate is positioned in proximity to the acceptor substrate, with the second surface facing toward the acceptor substrate. Pulses of laser radiation are directed to pass through the first surface of the donor substrate and impinge on the donor films so as to induce ejection of droplets of molten material of the specified composition from the donor films onto the acceptor substrate.

There is additionally provided, in accordance with an embodiment of the present invention, a method for material deposition including providing a transparent donor substrate having opposing first and second surfaces and multiple donor films including different, respective metallic elements on the second surface. The donor substrate is positioned in proximity to the acceptor substrate, with the second surface facing toward the acceptor substrate. Pulses of laser radiation are directed to pass through the first surface of the donor substrate and impinge on the donor films with beam parameters selected so as to induce ejection of droplets of molten material from the donor films of suitable composition and temperature to form an amorphous alloy on the acceptor substrate.

There is additionally provided, in accordance with an embodiment of the present invention, a method for material deposition including specifying a composition of a compound material to be deposited on an acceptor substrate. A transparent donor substrate is provided having opposing first and second surfaces and multiple donor films including different, respective components of the specified composition formed on the second surface and having respective layer compositions selected responsively to the specified composition. The donor substrate is positioned in proximity to the acceptor substrate, with the second surface facing toward the acceptor substrate. Pulses of laser radiation are directed to pass through the first surface of the donor substrate and impinge on the donor films so as to induce ejection of droplets of molten material of the specified composition from the donor films onto the acceptor substrate.

There is additionally provided, in accordance with an embodiment of the present invention, an apparatus for material deposition including a transparent donor substrate, a positioning assembly and an optical assembly. The transparent donor substrate has opposing first and second surfaces, and has multiple donor films including different, respective materials on the second surface. The positioning assembly is configured to position the donor substrate in proximity to an acceptor substrate, with the second surface facing toward the acceptor substrate. The optical assembly is configured to direct pulses of laser radiation to pass through the first surface of the donor substrate and impinge on the donor films so as to induce ejection of molten droplets containing a bulk mixture of the different materials from the donor films onto the acceptor substrate.

There is additionally provided, in accordance with an embodiment of the present invention, an apparatus for material deposition including a transparent donor substrate, a positioning assembly and an optical assembly. The transparent donor substrate has opposing first and second surfaces, and has multiple donor films disposed in a non-uniform distribution on the second surface. The positioning assembly is configured to position the donor substrate in proximity to an acceptor substrate, with the second surface facing toward the acceptor substrate. The optical assembly is configured to direct pulses of laser radiation to pass through the first surface of the donor substrate and impinge on the donor films at a location selected responsively to the non-uniform distribution, so as to induce ejection of droplets of molten material from the donor films onto the acceptor substrate.

There is additionally provided, in accordance with an embodiment of the present invention, an apparatus for material deposition including a transparent donor substrate, a positioning assembly and an optical assembly. The transparent donor substrate has opposing first and second surfaces, and has multiple donor films formed on the second surface. The donor films include different respective components of a composition of a compound material to be deposited on an acceptor substrate, and have respective layer thicknesses selected responsively to the specified composition. The positioning assembly is configured to position the donor substrate in proximity to the acceptor substrate, with the second surface facing toward the acceptor substrate. The optical assembly is configured to direct pulses of laser radiation to pass through the first surface of the donor substrate and impinge on the donor films so as to induce ejection of droplets of molten material of the specified composition from the donor films onto the acceptor substrate.

There is additionally provided, in accordance with an embodiment of the present invention, an apparatus for material deposition including a transparent donor substrate, a positioning assembly and an optical assembly. The transparent donor substrate has opposing first and second surfaces and multiple donor films including different, respective metallic elements on the second surface. The positioning assembly is configured to position the donor substrate in proximity to an acceptor substrate, with the second surface facing toward the acceptor substrate. The optical assembly is configured to direct pulses of laser radiation to pass through the first surface of the donor substrate and impinge on the donor films with beam parameters selected so as to induce ejection of droplets of molten material from the donor films of suitable composition and temperature to form an amorphous alloy on the acceptor substrate.

There is additionally provided, in accordance with an embodiment of the present invention, an apparatus for material deposition including a transparent donor substrate, a positioning assembly and an optical assembly. The transparent donor substrate has opposing first and second surfaces and has multiple donor films formed on second surface. The donor films include different, respective components of a specified composition of a compound material to be deposited on an acceptor substrate, and have respective layer compositions selected responsively to the specified composition. The positioning assembly is configured to position the donor substrate in proximity to an acceptor substrate, with the second surface facing toward the acceptor substrate. The optical assembly is configured to direct pulses of laser radiation to pass through the first surface of the donor substrate and impinge on the donor films so as to induce ejection of droplets of molten material of the specified composition from the donor films onto the acceptor substrate.

There is additionally provided, in accordance with an embodiment of the present invention, a donor device including a transparent donor substrate and multiple donor films. The transparent donor substrate has opposing first and second surfaces. The multiple donor films are formed on the second surface in a non-uniform distribution, such that when the donor substrate is positioned in proximity to an acceptor substrate with the second surface facing toward the acceptor substrate, and pulses of laser radiation pass through the first surface of the donor substrate and impinge on the donor films at a location selected responsively to the non-uniform distribution, droplets of molten material eject from the donor films onto the acceptor substrate.

There is additionally provided, in accordance with an embodiment of the present invention, a donor device including a transparent donor substrate and multiple donor films. The transparent donor substrate has opposing first and second surfaces. The multiple donor films are formed on the second surface, include different respective components of a composition of a compound material to be deposited on an acceptor substrate, and have respective layer thicknesses selected responsively to the specified composition, such that when the donor substrate is positioned in proximity to an acceptor substrate with the second surface facing toward the acceptor substrate, and pulses of laser radiation pass through the first surface of the donor substrate and impinge on the donor films, droplets of molten material of the specified composition eject from the donor films onto the acceptor substrate.

There is additionally provided, in accordance with an embodiment of the present invention, a donor device including a transparent donor substrate and multiple donor films. The transparent donor substrate has opposing first and second surfaces. The multiple donor films are formed on the second surface, include different respective components of a composition of a compound material to be deposited on an acceptor substrate, and have respective layer compositions selected responsively to the specified composition, such that when the donor substrate is positioned in proximity to an acceptor substrate with the second surface facing toward the acceptor substrate, and pulses of laser radiation pass through the first surface of the donor substrate and impinge on the donor films, droplets of molten material of the specified composition eject from the donor films onto the acceptor substrate.

The present invention will be more fully understood from the following detailed description of the embodiments thereof, taken together with the drawings in which:

BRIEF DESCRIPTION OF THE DRAWINGS

FIG. 5 is a schematic, sectional illustration of a LIFT process using a multilayered donor, in accordance with an embodiment of the present invention;

DETAILED DESCRIPTION OF EMBODIMENTS

Overview

Figure 1:
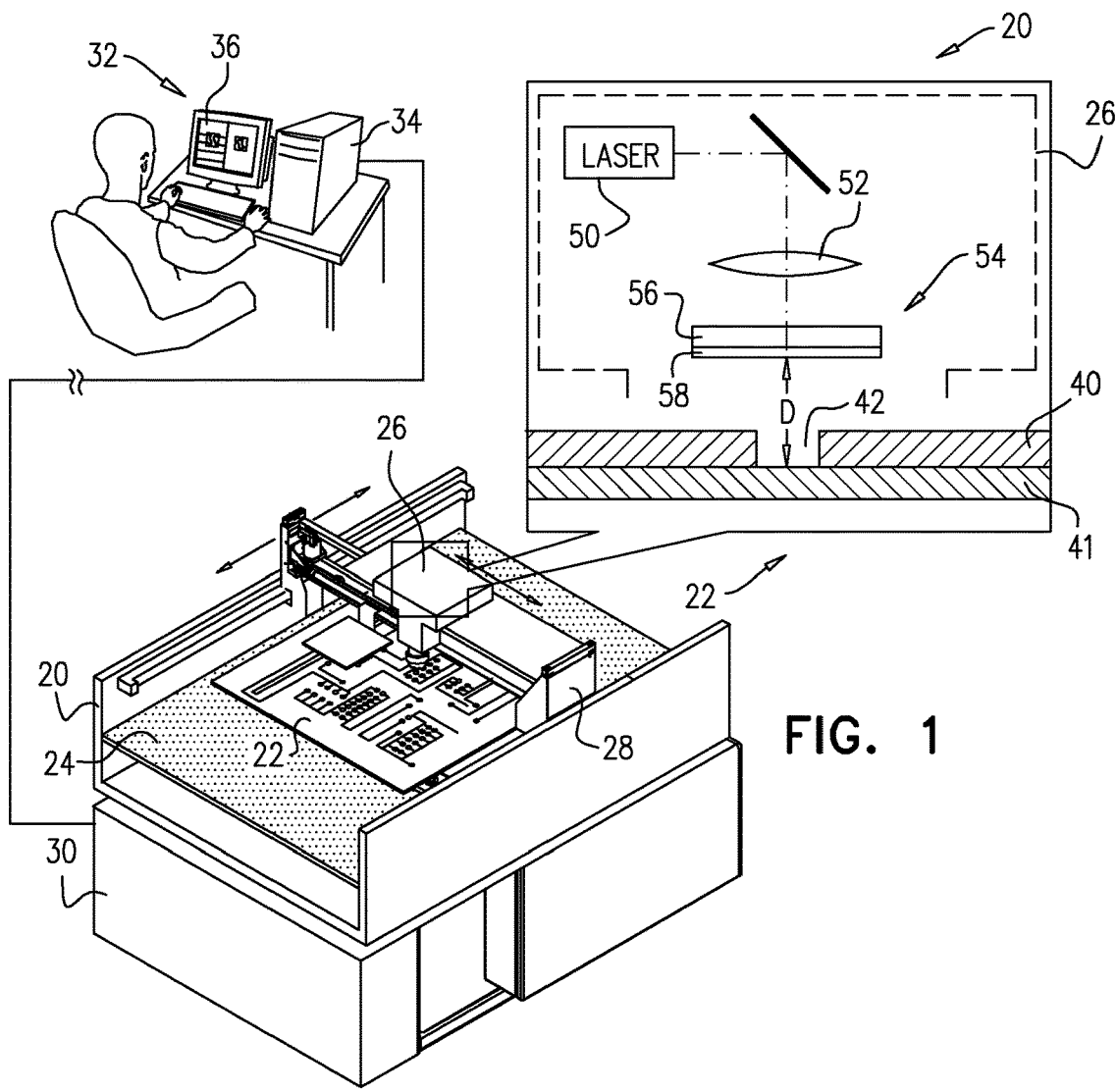
FIG. 1 is a schematic, pictorial illustration of a system for direct writing on a substrate, in accordance with an embodiment of the present invention.

Embodiments of the present invention that are described hereinbelow provide methods and apparatus that enhance the capabilities and usability of LIFT. The enhancements offered by these embodiments are useful in PCB, IC Substrate, FPD manufacturing, printing of metal circuitry on various substrates (paper, plastic, ceramic, etc.), and particularly printed 3D metal structures. The disclosed techniques are by no means limited to these specific application contexts, however, and aspects of the embodiments described herein may also be applied, mutatis mutandis, to LIFT-based printing on acceptor substrates of other sorts, including printing of both metallic and non-metallic materials. Specifically, these techniques may be adapted for use in various printed electronics and three-dimensional (3D) printing applications.

In a typical LIFT-based system for metal printing, high-energy laser pulses impinging on the donor film cause a spray of minute metal droplets to be ejected from the film. Typically, the donor film in such systems comprises a single layer of fixed, uniform composition, and the metal that is printed on the acceptor necessarily has this same composition.

Embodiments of the present invention overcome this limitation by providing different, novel types of donor structures and corresponding methods of operation of LIFT systems. Specifically, the disclosed embodiments use multiple different donor layers, which may be distributed non-uniformly over the surface of the donor, in controlling the composition and structure of layers that are printed on the acceptor.

In the disclosed embodiments, the donor used in a LIFT system typically comprises a transparent carrier substrate, coated with multiple absorbing films of different compositions. When the laser beam is incident on the donor, materials from two or more of these films are simultaneously ejected from the donor and mix together during the incubation time and during flight, so that the material that is deposited and solidifies on the acceptor comprises a combination of the materials from the different films. In some embodiments, the different films comprise different metallic elements, which form an alloy in flight that is then deposited on the acceptor. The alloy may be crystalline or, under appropriately-controlled conditions, amorphous, i.e., a metal glass. Alternatively, at least one of the films may comprise a non-metallic material.

A principle of these embodiments is that the LIFT system and its modules (laser, donor-acceptor distance, acceptor, motion control and other modules) are properly set and synchronized with the different donor layers and their structure to impinge on a donor film at a location that is selected responsively to the distribution of the donor layers so as to eject material of a target composition onto the acceptor.

For example, typical electric circuits require good adhesion between the acceptor substrate and the printed bulk metal layer (such as copper). Such adhesion can be achieved by creating an accurate alloy with good adhesion (in addition to its required physical properties such as conductivity) or by creating a dedicated adhesion layer between the surfaces of the acceptor and the bulk metal. Both options are difficult to achieve by known LIFT processes.

Some embodiments overcome this difficulty by applying multiple layers on the donor and dividing the donor's surface into different sections, wherein each section is applied to form a different layer or set of layers (such as adhesion layers) that provide the required adhesion while maintaining or improving the physical properties specification of the entire stack.

Accurate alloying is important to control the physical properties of each layer and of the entire stack of the acceptor. Accurate elemental composition by location is critical for mechanical, electrical, magnetic, corrosion-resistance and other physical and chemical properties. LIFT process is limited to provide discrete compositions based on the donor's structure.

Some embodiments enable location-based tunable (self-alloying) composition control by forming a gradual layer thickness or a non-uniform transverse distribution of different materials at one or more of the donor layers, which allows to form a tunable and accurate composition of the target acceptor's layer at every specific location across the acceptor in order to meet the required physical and chemical specification. Some embodiments are applicable for a wide range of materials, such as but not limited to; metals and metal alloys, metal compounds, refractory metals, Tin and Tin alloys, complex alloy compositions, other multi-component materials (not necessarily alloys), metal glasses, complex dielectric compositions and metal matrices.

Adhesion quality is a known challenge in manufacturing of electronic devices. Specifically, adhesion issues may occur when depositing a wide variety of metals on common substrates such as glass, polymers (e.g. PET, PEN, PI), or on substrates coated with special layers such as silicon-nitrides, ITO, silicon-oxides, or any other conducting or isolating layers.

For example, copper printing on glass typically require a thin inter-layer (e.g. Molybdenum) which has good adhesion to glass and serve to improve the adhesion of the entire stack. Another example is copper printing on ITO. Some embodiments overcome the adhesion difficulty by self-alloying such materials to improve the intrinsic adhesion of a bulk layer to the acceptor's surface.

Adhesion issues are partially due to the alloy composition and in some cases, also due to transient alloying effects at the acceptor's surface. For example, partially oxidized aluminum forms improved adhesion to AZO and ITO surfaces compared to a fully oxidized aluminum layer. An embodiment can overcome this difficulty by providing a controlled gas environment during the LIFT process.

LIFT process is jetting molten minute droplets that can reach very high temperature. The high temperature of the droplet can induce a partial or complete chemical reaction between the metal droplet and the ambient atmosphere and change the composition of the printed material on the substrate.

In some embodiments adjustment of several LIFT process parameters can control the reaction rate and the composition of the printed material. Examples of such parameters are droplet temperature, droplet volume, droplet jetting and transit time, incubation time, substrate properties and atmospheric conditions.

For example, printing aluminum alloys in standard atmospheric conditions creates a thin aluminum oxide ($Al_2O_3$) film on the surface. Metal oxidation is a diffusion process and therefore temperature, gas pressure and time are key parameters to define the rate and the degree of the oxidation on the metal surface.

In some embodiments, the printed material composition on the acceptor can be adjusted by the gas type and its relative pressure and flow during LIFT processes. This atmospheric condition must be accompanied by tight control of other process parameters such as droplet's volume, droplet's temperature, jetting, transit time, incubation time, acceptor's substrate conditions and more. Similar considerations are applicable for other metals of interest and other atmospheric environments.

Copper alloys are commonly used in PCB and IC substrate applications mainly as interconnects. Copper is a better conductor than aluminum, easier to process by electroplating, and demonstrates better soldering quality compared to aluminum. An embodiment is applicable for direct deposition of fine 2D and 3D structures made of multiple layers of materials that are not easy to pattern, such as copper alloys. By melting multiple layers in the donor and solidifying those on the acceptor one can create a fine structure of such hard-to-pattern alloys according to the electronic design and required process specifications.

Some materials cannot form stable compounds or alloys. In order to mix them one has to melt them and then cool them extremely fast. Bulk materials are hard to mix in this method due to slow heat transfer from the bulk to the surface and vice versa. Some embodiments overcome this difficulty by applying multiple thin layers of such materials in selected number and order of layers and specific thickness and composition of each layer on the donor. Then a LIFT process is applied which creates quasi-stable compounds or alloys by fast melting of the entire stack on the donor to create minute droplets to be ejected from the film towards the acceptor followed by an ultra-fast cooling of the droplets on-the-fly or after landing on the acceptor. Such ultra-fast heating and cooling processes can form quasi-stable compounds and alloys in accurate mixing that are very hard to achieve in other methods.

Metal alloying processes may result in an elemental segregation to form particles of intermetallic compounds, which are usually located in the grain boundaries of the polycrystalline alloy. In some embodiments an accurate structure of the donor layers and a respective LIFT process can be used for tight process control of metal alloying and elemental segregation formation. For example, typical alloys for PCB applications are copper alloys with Gold, Silver, aluminum and Platinum in binary, ternary, quaternary and other embodiments of Copper-based alloys. Such alloys are manufactured in a LIFT process by creating donors comprised of a layer of copper and significantly thinner layers of its alloying elements (e.g., gold, platinum, silver) according to the respective target elemental mix of the target alloy. For example, a 98% copper alloy mixed with 2% Silver will dictate a two or more layered donor with a similar quantities to materials ratio.

Composite materials are materials made of two or more component materials with significantly different physical or chemical properties, that when combined, form a material with characteristics different from the individual components. The individual components remain separate and distinct within the finished structure. A Metal Matrix Composite (MMC) is a composite material with at least two constituent parts, one being a metal. The other material may be a different metal or another material, such as a ceramic or organic compound. MMC's are made of a wide range of materials and commonly used in a variety of applications.

In some embodiments, MMC's are manufactured by depositing multiple layers of different materials. By preparing the layered structures alternating metal and dielectric layers it is possible to obtain controlled metal matrix compositions, for example $Al/Al_2O_3$ that is a composition of much interest due to its superior mechanical properties. Such MMC's can be formed by aluminum oxidation and mixing in oxidizing atmosphere, or in a more controlled manner, by melting an aluminum layer and an oxide layer on the donor and depositing them on the acceptor in a non-oxidizing atmosphere. The matrix composition on the acceptor is defined by the thickness of each layer in the donor.

In another embodiment, it is easy to control the exact composition and structure of the MMC and other composite matrices by selecting respective number of layers and thickness of each layer on the donor. For example, a donor may comprise a thick layer of material A on top of a thick layer of material B (an AB stack). An alternative donor structure may comprise an alternating stack of six thin layers of the same materials (an ABABAB stack) comprising the same cumulative thickness of the AB stack in order to achieve better uniformity for the same volume of the final MMC layer.

In some embodiments, some of the layers may comprise metallic or non-metallic particles on the donor to which a LIFT process is applied to form the target MMC structure.

Physical properties such as mechanical strength and electrical resistivity are important elements in materials engineering to accomplished improved performance of a product. In some embodiments, accurate structures of the donor's layers enable accurate compositions of the alloy and controlled physical properties. For example, electrical resistivity can be tuned by modifying the alloy content. This embodiment is useful for example in PCBs' embedded passives, resistors with defined resistivity values and other applications. Another example, induced precipitation can improve the mechanical strength of the deposited material. By tight control of the donor's layers structure and composition one can control the physical properties such as resistivity and mechanical strength.

In some embodiments controlling the alloy composition at various positions of a printed 2D structure can create a uniform structure with variability of the physical properties such as electrical, mechanical, thermal, magnetic and other properties. In other embodiments of the present invention a 3D structure of multiple layers on the acceptor can enhance the physical properties of the end product. These layers can be deposited on the acceptor in a LIFT process by applying multiple layers and multiple patterns on the donor. Each predefined area on the donor can be used for creating a different layer on the acceptor.

Graded structures and regular or non-regular alloyed structures with varying composition are useful for several applications such as PCB, IC substrates and other applications. Current LIFT processes are limited to deliver such structures due to the high complexity of the structures. In some embodiments, tunable compositions and graded structures in the acceptor can be manufactured by graded thicknesses of the donor layers and by patterns of different alloys in specific layers of the donor.

Soldering processes are widely utilized in electronic devices, mainly to connect electronic boards to their interfaces. The large variety of materials in electronic boards and the tight specifications of the end-products are dictating large variety of soldering materials. Soldering materials are typically based on Tin alloys and each application requires specific properties of its respective Tin alloy. The variability of the solder properties with compositions is often used for specific applications requiring special melting temperature, mechanical properties and other physical properties according to the specific application. In some embodiments, a donor comprising multiple layers with a non-uniform structure can provide tailored solder materials for specific application in a simple and convenient manner. In other embodiments graded and non-uniform layers in the donor can provide gradual compositions of solder structures in the acceptor.

The requirement for a large variety of compositions and structures may exist in other materials besides Tin alloys. In some embodiments this complexity can be solved by applying LIFT processes with multilayered donors comprising a different thickness and composition of each layer.

Electret is a dielectric material which has a quasi-permanent embedded electric charge. There are different types of electrets based on Polymers or based on dielectric materials with embedded charged metal particles. In some embodiments a LIFT process comprising multilayered donor with stacked dielectric layers and charged metal layers is used. The donor's stack structure is similar to the ABABAB structure mentioned in this document where A is a dielectric and B is a metal and the charge is applied on the metal layers. During the LIFT process, high-energy laser pulses impinging on the donor stack cause a spray of a mix of dielectric and charged metal droplets to be ejected from the donor stack and forming electrets. The formed electrets comprise a dielectric matrix with embedded charged metal particles. Metallic glasses (amorphous metals) are very attractive materials for many applications in electronic devices such as tunable resistors and packaging materials for mobile electronic devices. Metal-glasses are created by melting metals and quenching them to a quasi-stable amorphous state. In some embodiments many kinds of metallic glasses can be formed by LIFT processes thanks to a quenching process of the micro-droplet at typical cooling rates of $10^{10}$ degrees per second. In one example model, a 1000° C. droplet solidifies in 10 nS. These embodiments comprise binary-element metal glasses of elements that are hard to mix (e.g., zirconium and copper), multi-component alloys and new metal-glass compositions. The number of elements and their mixture can be controlled by the multi-layer structure of the donor. Other embodiments are mixed structures of metal glass and polycrystalline metals in various mixing structures that can be systematic, uniform, random, and gradual or any alternative form.

In yet other embodiments, a bulk mixture in the donor is formed during the LIFT process throughout the entire volume of the micro-droplet to form a uniform alloy. In a droplet formation regime the nature of the alloying process reveals itself as full mixing regime, as opposed to a partial interaction of an unclear nature.

System Description

FIG. 1 is a schematic, pictorial illustration of a system for direct writing on a substrate 41, in accordance with an embodiment of the present invention. This system and its components are shown here solely to illustrate the sort of environment in which the techniques described herein may be implemented. Such techniques may similarly be carried out using suitable equipment of other types and in other configurations.

The system of FIG. 1 is built around print and direct write apparatus 20, which operates on a substrate of an electronic circuit, such as a Flat panel Display (FPD) or a printed circuit board (PCB) 22, which is held on a mounting surface 24. The terms "Flat panel Display", "FPD", "printed circuit board", and "PCB" are used herein to refer generally to any sort of a dielectric or a metal or a semiconductor substrate on which conductive traces are deposited, regardless of the type of substrate material and the process used for deposition. Apparatus 20 may be used to deposit new layers such as printing of metal circuitry on various substrates or in any other electronic devices.

Figure 2:
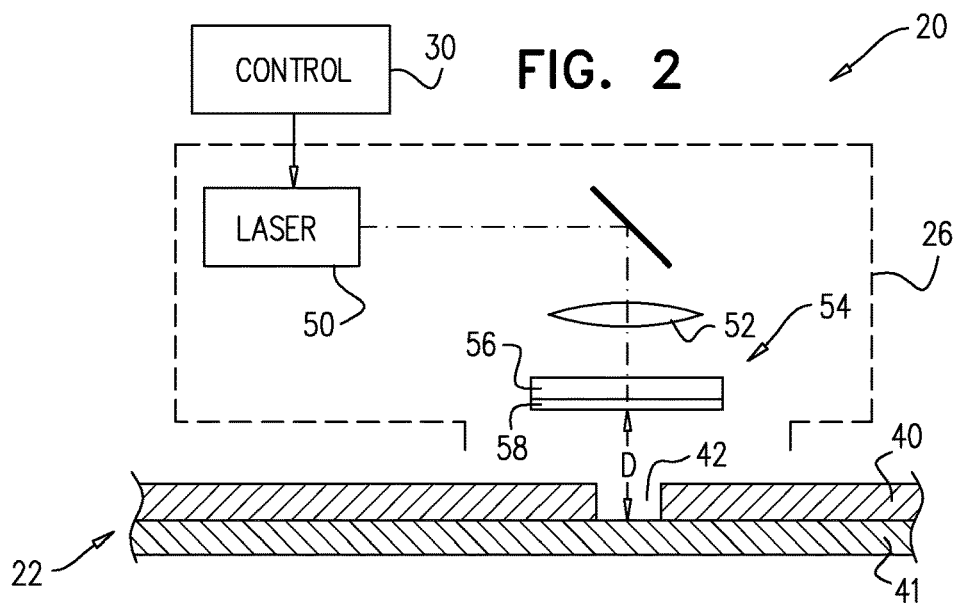
FIG. 2 is a schematic side view showing details of the system of FIG. 1, in accordance with an embodiment of the present invention.

Apparatus 20 comprises an optical assembly 26, containing a suitable laser and optics for LIFT and associated operations on the substrate, as shown in greater detail in FIG. 2. (Alternatively, the laser may be contained in a separate unit, not shown in the figures, with a suitable optical connection to assembly 26). In some embodiments, direct printing applications, such as patterning or layer deposition on a PCB or FPD or any other pertinent device, may comprise other diagnostics capabilities that may be in-situ (i.e., monitoring during the printing process), integrated (i.e., monitoring selected devices immediately after completion of the LIFT process), or offline, by a stand-alone diagnostics system.

A positioning assembly, in the form of a bridge 28, positions optical assembly 26 over pertinent sites on the substrate in question, by linear motion along the axes of apparatus 20. A control unit 30 controls the operation of the optical and positioning assemblies, and carries out additional functions such as temperature control, so as to carry out the required inspection, printing, patterning and/or other manufacturing and repair operations, as described below.

Typically, control unit 30 communicates with an operator terminal 32, comprising a general-purpose computer including a processor 34 and a display 36, along with a suitable user interface and software.

FIG. 2 is a schematic side view showing details of apparatus 20, and particularly of optical assembly 26, in accordance with an embodiment of the present invention. A laser 50 emits pulsed radiation, which is focused by suitable optics 52. The laser may comprise, for example, a pulsed Nd:YAG laser with frequency-doubled output, which permits the pulse amplitude and duration to be controlled conveniently by control unit 30. Optics 52 are similarly controllable in order to adjust the location and size of the focal spot formed by the laser beam. In some embodiments it may thus be possible, with suitable adjustment of the laser and optical parameters, to use the same laser 50 for several or all of the pre-treatment, LIFT, and post-treatment steps.

Alternatively, an additional laser (not shown), with different beam characteristics, may be used for some of these steps. It is desirable that such an additional laser, if used, operate at the same wavelength as laser 50 in order to simplify the optical setup. In another embodiment the additional laser may operate in another wavelength and another optics setup, which may be dedicated for the described purpose, or for multiple purposes.

Optical assembly 26 is shown in FIG. 2 in the LIFT configuration. Optics 52 focus the beam from laser 50 onto a donor sheet 54, which comprises a donor substrate 56 with a donor film 58. Typically, substrate 56 comprises a transparent optical material, such as glass or a plastic sheet, or other types of substrates such as silicon wafers, flexible plastic foils, ceramic or glass, and typical PCB substrates (e.g. epoxy based). The beam from laser 50 is aligned (by motion assembly 28) with the site of defect 42, and donor sheet 54 is positioned above the site at a desired gap width D from a substrate 41 of PCB 22. Typically, this gap width is at least 0.1 mm, and the inventors have found that gap widths of 0.2 mm or even 0.5 mm or greater can used, subject to proper selection of the laser beam parameters.

In generic LIFT processes substrate 41 is also known as receiver or acceptor. Optics 52 focus the laser beam through the outer surface of substrate 56 onto film 58, thereby causing droplets of molten metal to be ejected from the film, across the gap and onto the surface of device substrate.

Figure 3:
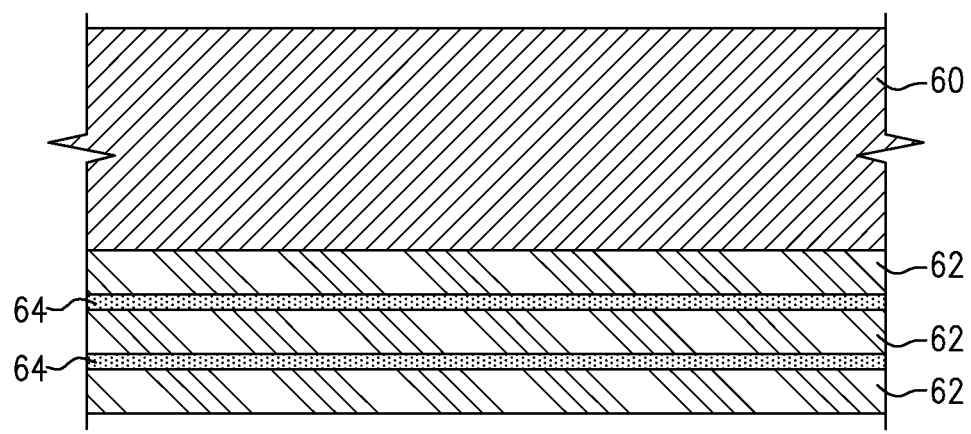
FIGS. 3 and 4 are schematic, sectional views showing details of multilayered LIFT donors, in accordance with embodiments of the present invention.

FIG. 3 is a schematic, sectional view showing details of a multilayered LIFT donor, in accordance with an embodiment of the present invention. Donor's substrate 60 is transparent to a laser that is applied in the LIFT process. In an embodiment, layers 62 and 64 are deposited alternately on the donor's substrate to form a multilayered stack of two different respective materials.

Copper is commonly used in PCB and IC substrate applications mainly as interconnects. Copper is a better conductor than aluminum, easier to process by electroplating, and demonstrates better soldering quality compared to aluminum.

Figure 4:
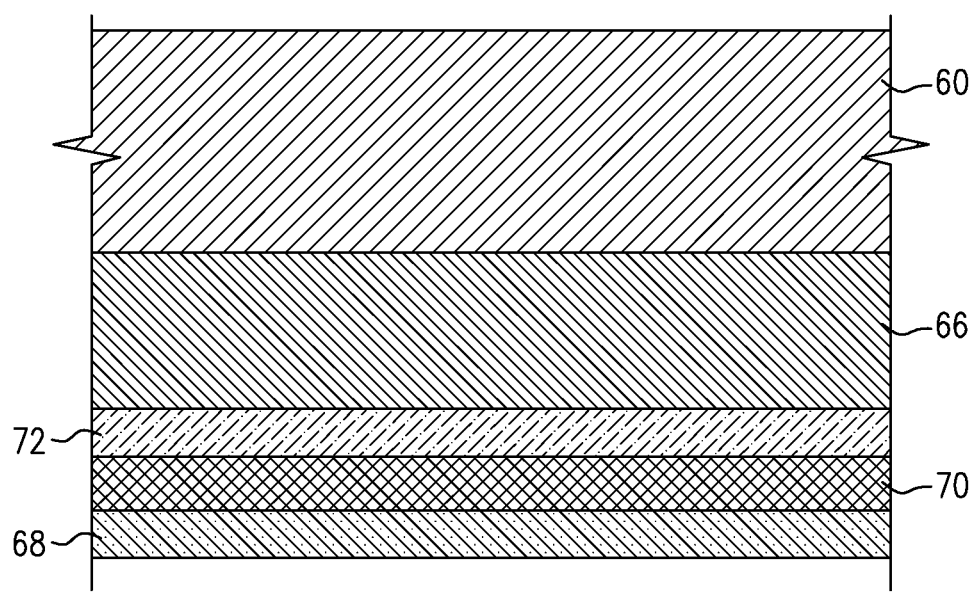

FIG. 4 is a schematic, sectional view showing details of a multilayered LIFT donor, in accordance with an embodiment. FIG. 4 shows an embodiment with multiple layers placed on donor's substrate 60 where the number of layers, the type of layers and the thickness of each layer can vary. FIG. 4 shows four different layers: a relatively thick layer 66, which is coated by a thin layer 72, which is coated by a slightly thicker layer 70, which is coated by a thin layer 68.

In some embodiments the printed material composition on the acceptor can be adjusted by the ambient atmospheric conditions, the relative pressure and flow during the LIFT processes. This atmospheric condition must be accompanied by tight control of other process parameters such as droplet's volume, droplet's temperature, jetting, transit time, incubation time, acceptor's substrate conditions and other process parameters. Similar considerations are applicable for various metals of interest and other atmospheric environments.

Metal alloying processes may result in an elemental segregation to form particles of inter-metallic compounds, which are usually located in the grain boundaries of the polycrystalline alloy. In some embodiments an accurate structure of the donor layers and a respective LIFT process can be used for tight process control of metal alloying and formation of segregated compounds. For example, typical alloys are copper alloys with gold, silver, aluminum and platinum in binary, ternary, quaternary or other embodiments of copper-based alloys. Such alloys are manufactured in a LIFT process by creating donors, which comprises a layer of copper and significantly thinner layers of its alloying elements (e.g., gold, platinum, silver) according to the respective target elemental mix of the target alloy. For example, a 98% copper alloy mixed with 2% Silver will dictate a two or more layered donor with a similar quantities to materials ratio.

In another embodiment users can print complex alloys, such as alloys comprising 4-5 elements, which are hard to manufacture in other techniques.

FIG. 5A is a schematic, sectional illustration of step one of the LIFT process, in accordance with an embodiment of the present invention. FIG. 5A shows an embodiment where the beam of laser 50 passes through the donor's substrate and melts several layers of 74 and 76 to form a liquid melt 78 of a mixture of layers 74 and 76. The liquid melt propagates by a pressure vector, which is typically normal to the transparent substrate and formed by melting and vaporizing of the metal layer. Interface 79 is the border between liquid melt 78 and the solid multilayered structure of layers 74 and 76.

FIG. 5B is a schematic, sectional illustration of step two of the LIFT process, in accordance with an embodiment of the present invention. FIG. 5B shows how a droplet 80 (typically a micro droplet) which is formed from melt 78 presented in FIG. 5A, departs from the donor, still in a liquid state, and travels towards the substrate of acceptor 88. In an embodiment, droplet 80 comprises a mixture of the materials in the stacked layers 74 and 76.

FIG. 5C is a schematic, sectional illustration of step two of the LIFT process, in accordance with an embodiment. FIG. 5C shows how droplet 80 from FIG. 5B lands on the surface of acceptor 88 and solidifies to generate a solid alloy 82. Alloy 82 is comprised of a mixture of the materials in the stacked layers 74 and 76.

Figure 6:
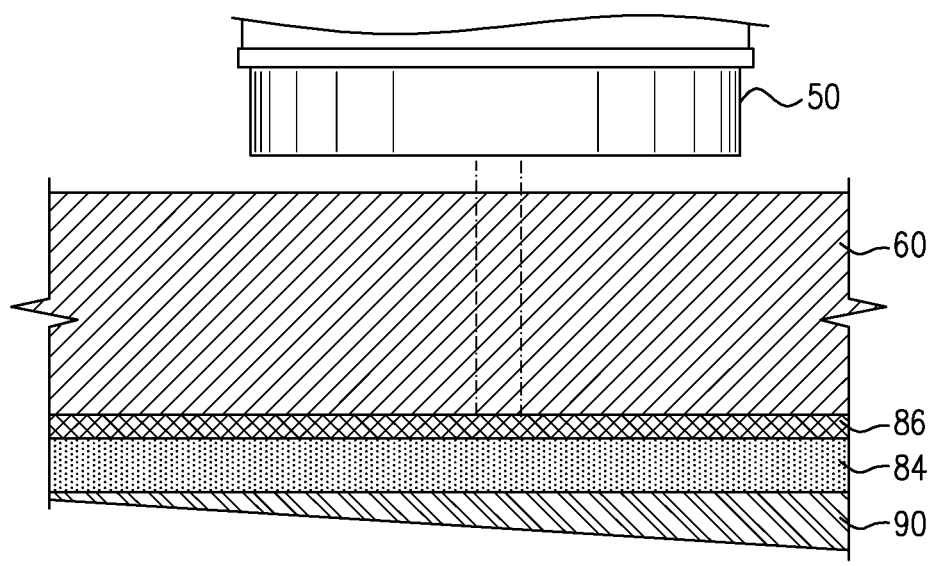
FIGS. 6 and 7 are schematic, pictorial side views showing details of multilayered donors, in accordance with embodiments of the present invention.

FIG. 6 is a schematic, pictorial side view showing details of multilayered donors, in accordance with embodiments. Laser 50 points at donor's substrate 60, layer 86 is deposited on donor's substrate 60, layer 84 is placed on layer 86, and layer 90 is deposited on layer 84. FIG. 6 shows an embodiment where layer 90 has a graded thickness structure. This structure may be applied to generate a tunable alloy of layers 84, 86 and 90, which allows the users to choose any portion (and hence, percentage) of layer 90 they wish to compose the alloy.

In an alternative embodiment, the same structure may be used to generate groups of specific mixtures of layers 84, 86 and 90 on the acceptor. For example, after the LIFT process, part of the acceptor's area, (not shown in this figure), is coated with a mixture of layers 84, 86 and 90 where the relative percentage of layer 90 is 30% of the deposited alloy and the other part of the acceptor's area is coated with a mixture of the same layers where the relative percentage of layer 90 is 10% of the deposited alloy. In other embodiments, the relative portion of layer 90 in the alloy is tunable (by mixture and location) by the relative positions of laser 50, donor 60 and acceptor 88 which is controllable as described in FIG. 1.

Soldering processes are widely used in electronic devices, mainly to connect electronic components to boards. The large variety of materials in electronic boards and the tight specifications of the end-products are dictating large variety of soldering materials. Soldering materials are typically based on Tin alloys and each application requires specific properties of its respective Tin alloy.

The variability of the solder properties with compositions is often used for specific applications requiring special melting temperature, mechanical properties and other physical properties according to the specific application. In some embodiments, a donor comprising multiple layers with a non-uniform structure can provide tailored solder materials for specific application in a simple and convenient manner. In other embodiments graded and non-uniform layers in the donor can provide gradual compositions of solder structures in the acceptor.

The requirement for a large variety of compositions and structures may exist in other materials besides Tin alloys. Some embodiments can overcome this complexity by applying LIFT processes with multilayered donors comprising a different thickness and composition of each layer.

Figure 7:
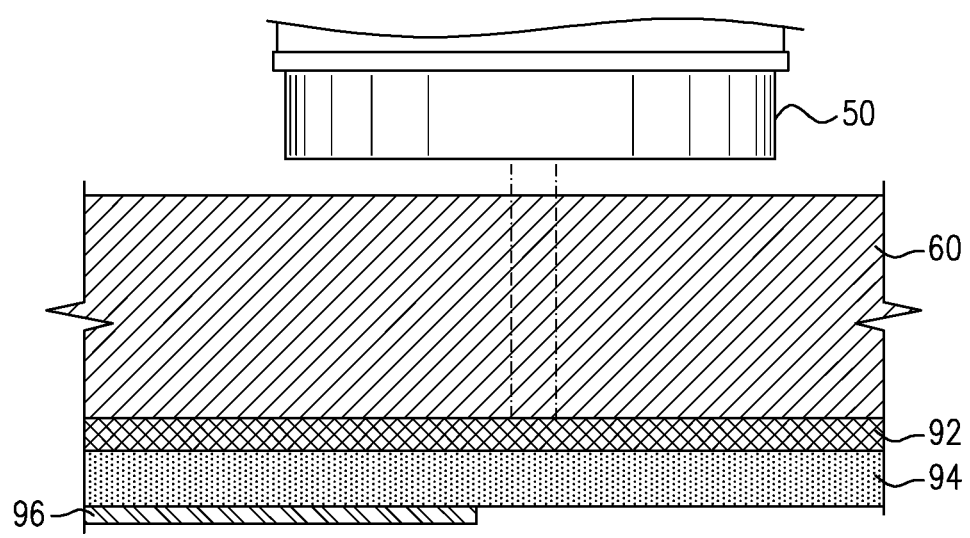

FIG. 7 is a schematic, pictorial side view showing details of multilayered donors, in accordance with embodiments. Laser 50 points at donor's substrate 60, layers 92 and 94 are stacked on donor's substrate 60, and layer 96 covers part of its predecessor layer 94. In an embodiment two alloy mixtures of layers 92, 94 and 96 may be achieved by a single LIFT process. For example, after the LIFT process, half of the acceptor's area, (not shown in this figure), may be coated with an alloy comprising 20% of layer 96 (a ternary alloy) while the other half of the acceptor's area may be coated by an alloy without layer 96 (a binary alloy).

The structure of the first half is achieved by pointing laser 50 on the left side of the donor in FIG. 7, and the structure of the second half (coated by the binary alloy) is achieved by pointing laser 50 on the right side of the donor. In another embodiment the different layers (i.e., binary and ternary) can be patterned on the acceptor in different shapes and ratios. For example, the binary layer can be printed in horizontal lines and the ternary, in vertical lines.

Some layers are more reflective to the laser beam then others and the thickness of each layer and the entire stack plays a role in the reflection level of the donor's stack.

Figure 8A:
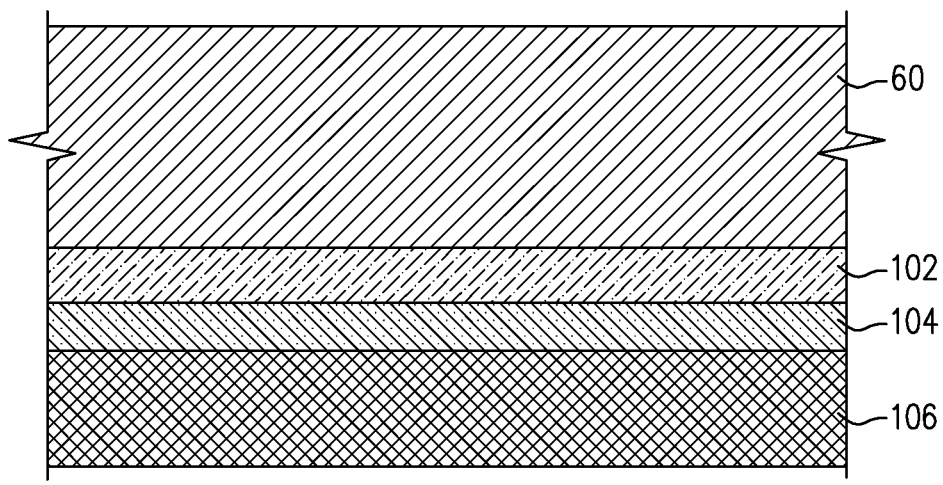
FIG. 8A is a schematic, sectional view showing details of a multilayered donor, in accordance with embodiments of the present invention.

FIG. 8A is a schematic, sectional view showing details of a multilayered donor, in accordance with embodiments. The efficiency of a LIFT process depends on the absorption level of the laser energy by the donor's stack. Layer 106, which is a highly reflective layer to the LIFT laser is deposited on layer 104 which is less reflective, and deposited on layer 102, which is a thin dielectric layer placed on donor's substrate 60. In an embodiment in order to achieve the highest absorption (i.e., least reflection) layer 104 is deposited before layer 106.

Figure 8B:
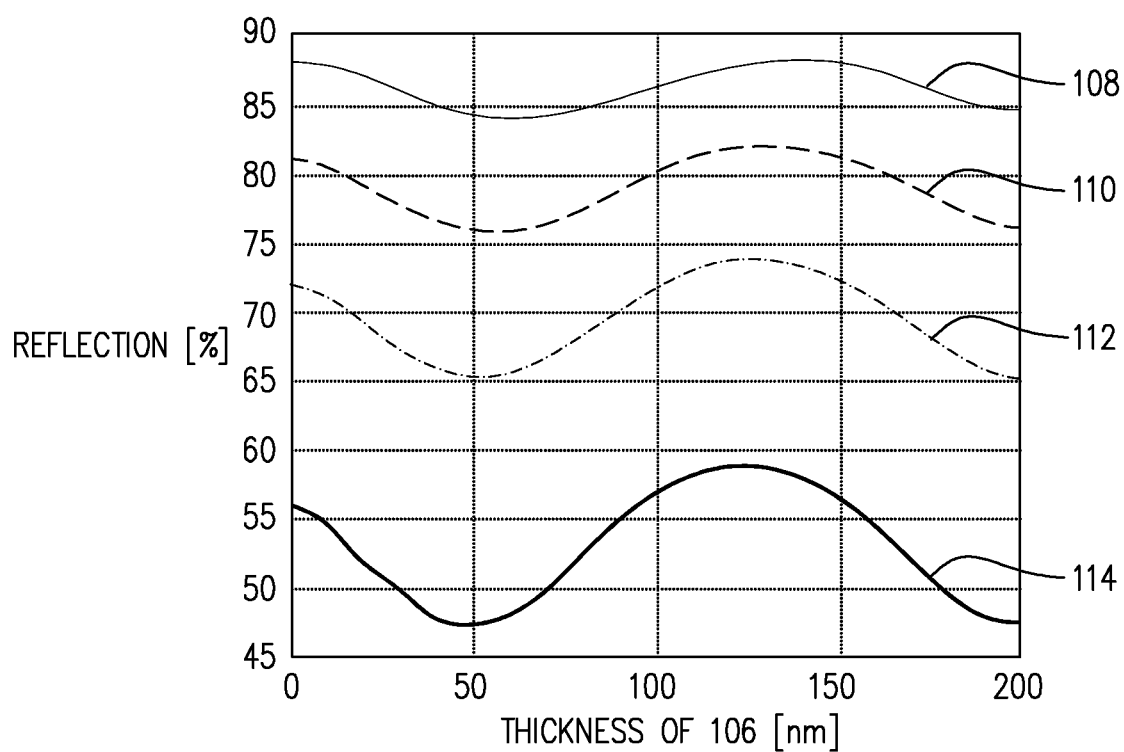
FIG. 8B is a chart showing correlation between the thickness of the layers in the donor of FIG. 8A and the reflectivity of the donor, in accordance with an embodiment of the present invention.

FIG. 8B is a chart showing correlation between the thickness of the layers in the donor of FIG. 8A and the reflectivity of the donor's stack, in accordance with an embodiment. As mentioned in the description of FIG. 8A, the type of layers, their order in the stack, and the thickness of each layer are important to set the total reflection of the donor's stack during a LIFT process. The chart in FIG. 8B shows the donor's reflectivity as a function of the thickness of layer 106 (on the horizontal axis) and four optional thicknesses of layer 104 as shown by curves 108, 110, 112 and 114.

For example, curve 114 represents a 50 nm thickness of layer 104, curves 112 and 110 represent 20 nm and 10 nm thickness of the same layer, and curve 108 represents the donor's reflection without layer 104. According to the chart, it is clear that the combination of 50 nm (or 200 nm) thickness of layer 106 with a 50 nm thickness of layer 104 provides the lowest reflectivity of the donor's stack. Consider for example the layered structure of FIG. 8A made of aluminum as layer 106 and of copper as layer 104 and the laser used for jetting is a 532 nm laser. The energy absorbed into the layered structure strongly depends on the donor architecture. If the aluminum layer is in contact with the glass substrate and the copper is deposited on the aluminum, the reflection is very high (>85%). If otherwise one deposits the copper and then the aluminum, the reflectivity is significantly lower (about 48%).

Figure 9A:
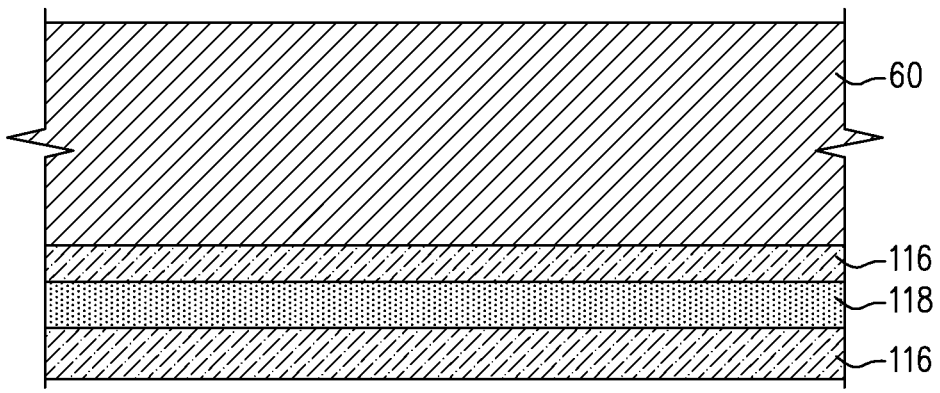
FIGS. 9A and 9B are schematic, sectional views showing details of a multilayered donor with two types of layers, in accordance with embodiments of the present invention.

FIG. 9A is a schematic, pictorial sectional view showing details of a multilayered donor with two types of layers in a structure of three thick layers, in accordance with embodiments. The donor's substrate is coated with a sandwich of two layers 116 with a single layer 118 between them. This structure is limited to achieve high mixing or alloying uniformity of layers 116 and 118 on the acceptor.

Figure 9B:
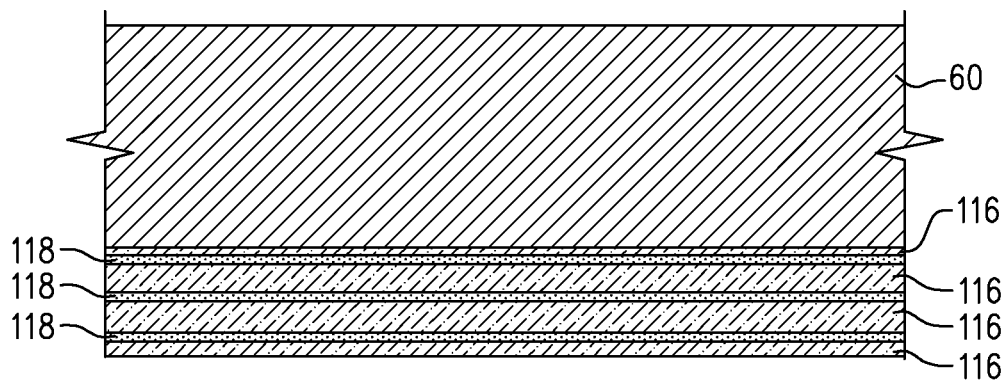

FIG. 9B is a schematic, sectional view showing details of a multilayered donor with the two types of layers shown in FIG. 9A, where the same amount of material is set in a structure of seven thin layers, in accordance with embodiments. In FIG. 9A, layers 116 and 118 are deposited on the donor's substrate in a structure of seven alternating layers 116 and 118 (an ABABABA structure where A represents layer 116 and B represents layer 118). In an embodiment this technique of layer thinning provides better efficiency and uniformity of layer mixing, compared to the structure of FIG. 9A.

In another embodiment, multiple thin layers provide better control of the actual melting temperature of the donor's stack. For example, the melting temperature of a single-layered alloy of the materials in layers 116 and 118 is defined based on the physical properties of the alloy and described in a so-called phase diagram of the respective materials. On the other hand, the structure in FIG. 9B provides the opportunity to control the melting temperature of the donor's stack based on the thickness and order of the layers. For example, by placing the highest melting temperature layer as the first layer on the donor's substrate and applying high laser energy, it is likely that the droplet temperature increases.

Figure 10:
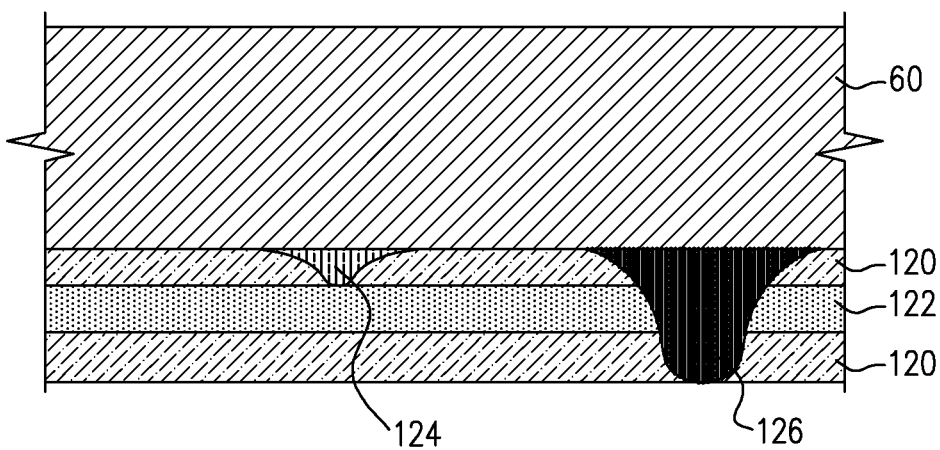
FIG. 10 is a schematic, sectional view showing details of a multilayered donor for controlling temperature of a droplet during a LIFT process, in accordance with embodiments of the present invention.

FIG. 10 is a schematic, pictorial side view showing details of layers structure and materials selection to control temperature of a droplet formed in a multilayered donor during a LIFT process, in accordance with embodiments. Layers 120 and 122 are deposited on the donor's substrate where the melting temperature of layer 122 is higher than the melting temperature of layer 120. Element 124 is the melted area created by applying a laser pulse energy that induce lower temperature than the melting temperature of layer 122. In such cases, layer 122 is not melted and the LIFT process is not functional.

In an embodiment, in order to melt the entire stack, users have to apply adequate conditions of the laser, such as laser energy, pulse width and spot diameter. For example, element 126 represents the melt when applying adequate laser conditions to induce higher temperature than the melting temperature of layer 122. This technique allows melting of the entire stack and conducting the LIFT process properly. For example the spot could be 30 um only and the printed droplet size 5um only. The reason for this is clearly understood by the phase transition from solid to liquid and the effect of surface tension, which is very high in the case of small molten metal droplets, which transforms the metal layer to a roundly shaped molten material.

In another embodiment the thickness of each layer and the number of layers helps to control the temperature of the melted alloy. Starting from a layered structure instead of a eutectic mixture allows achieving a substantially higher droplet temperature compared to the temperature obtained when starting with a donor layer comprising the eutectic composition.

In order to generate a eutectic mixture droplet from multiple (e.g., binary) different and separate metal layers, it is typically required to melt each of the metal layers. Since the pure metals have a higher melting temperature than the eutectic mixture, the eutectic droplet will have a higher temperature (higher than the melting temperature of each of the metal components).

For example, a eutectic mixture of Copper/Aluminum has a melting temperature (Tm) of 548° C., compared to 1048° C., which is the Tm of a pure copper, (copper has higher Tm among the two metals). Thus the temperature of the eutectic droplet is substantially higher (>500 degrees higher) compared to the temperature obtained for a eutectic mixture to start with (the maximal droplet temperature is determined by the melting temperature Tm but also by laser pulse and layer parameters).

By creating a donor with a multilayered structure, the droplet's temperature is controlled by the order and thickness of the donor's layers and by setting the appropriate laser conditions and scanning schemes of the LIFT process. For example, the melting temperatures of copper and titanium are 1084 deg C. and 1668 deg C. respectively. The Eutectic (24% titanium, 76% copper) melting temperature is about 900 deg C. which is about 700 deg C. lower than the titanium's melting temperature. In an embodiment one can achieve a higher droplet's temperature, even higher than the titanium's melting temperature by placing the titanium layer on top of the donor's substrate and adjusting the laser parameters accordingly.

The above technique allows tight control of the droplet's temperature and can be used for multiple applications such as metal glass and alloying of special mixtures of materials that are very hard or impossible to achieve otherwise.

Figure 11A:
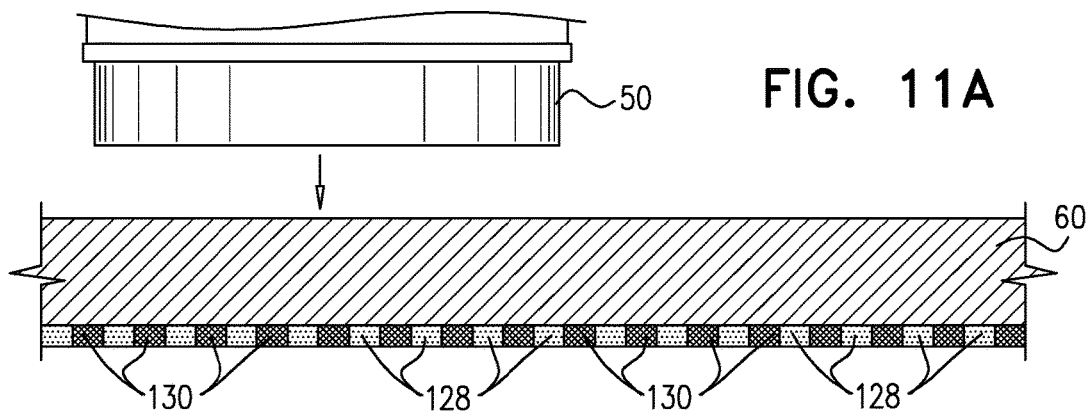
FIG. 11A is a schematic, pictorial detailed illustration of a side view and two top views of horizontally patterned donors, in accordance with embodiments of the present invention.

FIG. 11A is a schematic, pictorial detailed illustration of a side view of the horizontally patterned donor, in accordance with embodiments of the present invention. A single layer comprising material 128 and material 130 are deposited and patterned in a two-dimensional manner on the donor's substrate. Laser 50 is pointing on the donor's substrate.

Figure 11B:
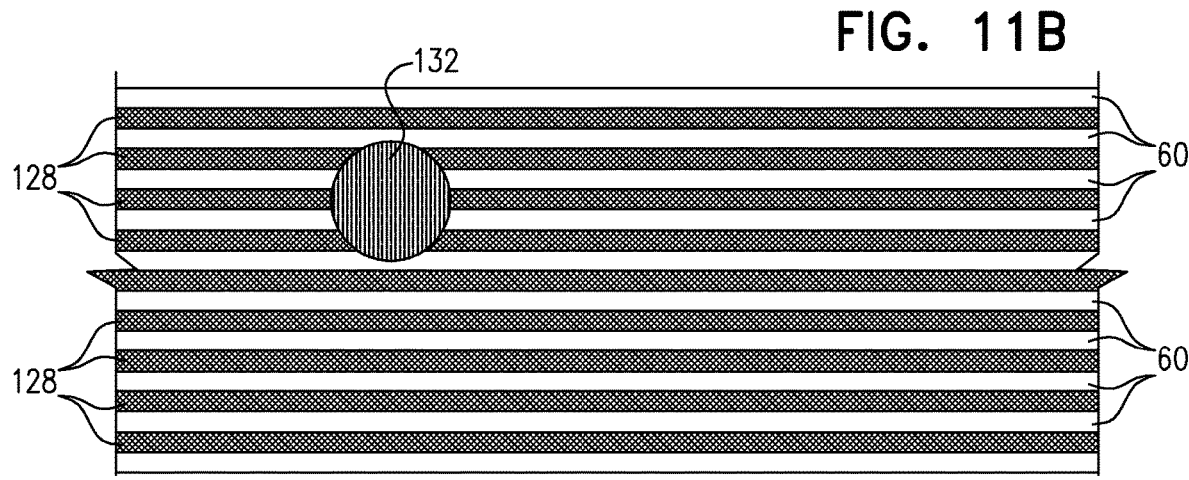
FIGS. 11B and 11C are schematic, top views of horizontally patterned donors, in accordance with embodiments of the present invention.

FIG. 11B is a schematic, pictorial detailed illustration of a top view of a horizontally patterned donor, in accordance with embodiments of the present invention. FIG. 11B represents a case where only one material (or alloy), 128, is deposited and patterned on the donor's surface and represented in dark lines in FIG. 11B where the white lines are the top view of the donor's substrate surface. Element 132 represents a laser spot of laser 50 in FIG. 11A. In some embodiments one or more materials are patterned in a two-dimensional pattern on the donor and the patterned features can be larger, smaller (as shown in FIG. 11) or similar to the laser spot's diameter. This configuration is practically similar to a single layered donor.

Figure 11C:
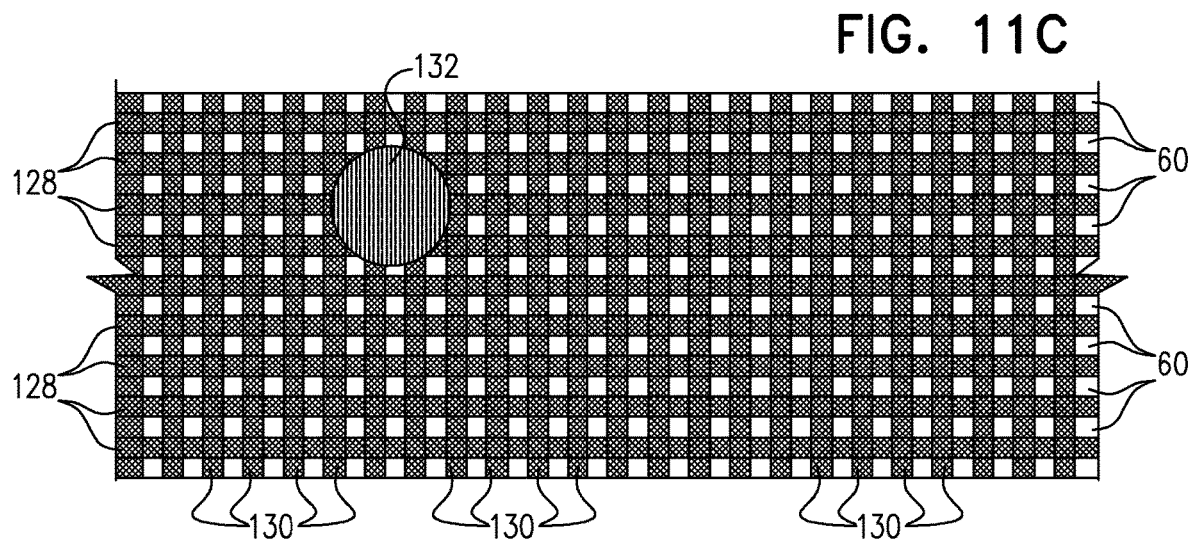

FIG. 11C is a schematic, pictorial detailed illustration of a top view of a horizontally patterned donor, in accordance with embodiments of the present invention. FIG. 11C represents a case where elements (e.g., materials or alloys) 128 and 130 are deposited and patterned on the donor's surface in a "chess board" manner where elements 128 and 130 are placed perpendicularly to each other in a crisscross manner. In other embodiments, the size, shape, mixture and location of each element can vary to create a uniform or a functional graded material (FGM) according to the desired process application. Element 132 represents a laser spot of laser 50 in FIG. 11A. In an embodiment the pattern is significantly smaller than the laser spot in order to create alloys (or compounds) of the corresponding materials. In another embodiment the pattern can be larger than the laser's spot in order to deposit a single element at specific locations on the acceptor's surface.

Figure 12A:
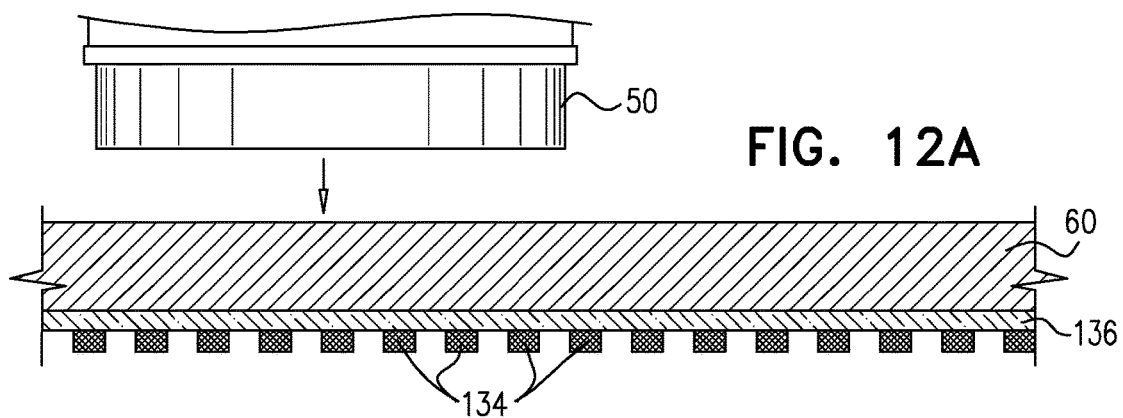
FIG. 12A is a schematic, pictorial detailed illustration of a side view of a horizontally patterned multilayered donor, in accordance with embodiments of the present invention.

FIG. 12A is a schematic, sectional illustration of laser 50 and a patterned multilayered donor, in accordance with embodiments of the present invention. Layer 136 is deposited on the donor's substrate and layer 134 is patterned on top of layer 134. Laser 50 is pointing at the donor and its spot is visible in the top view of FIG. 12B.

Figure 12B:
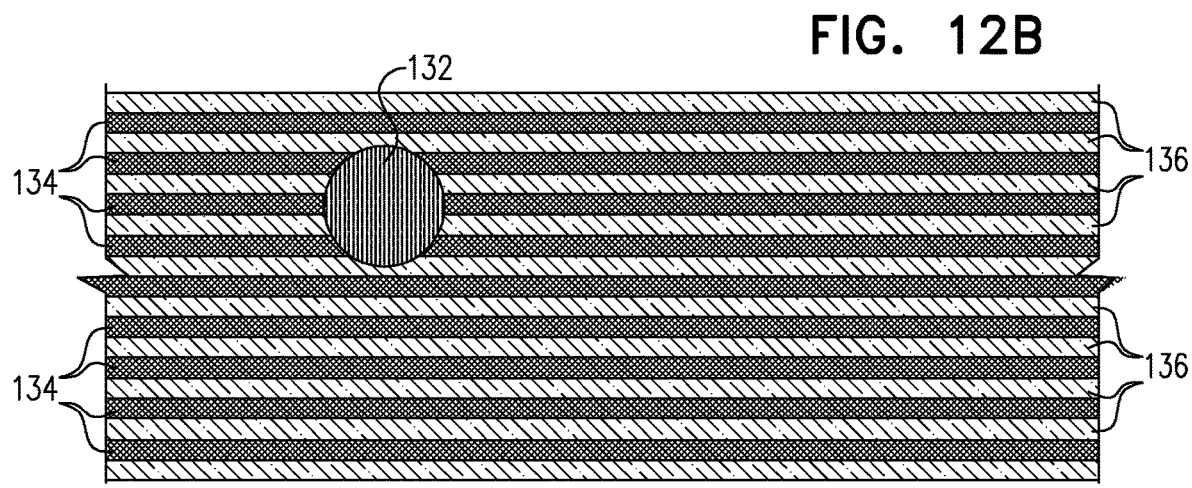
FIG. 12B is a schematic, top view of a laser spot and the patterned multilayered donor of FIG. 12A, in accordance with embodiments of the present invention.

FIG. 12B is a schematic, top view illustration of laser spot 132 and a patterned multilayered donor as shown in a sectional view of FIG. 12A, in accordance with embodiments of the present invention. In an embodiment the laser spot is significantly larger than the pattern and hence the LIFT process creates an alloy of layers 134 and 136. In other embodiments, the size, shape, mixture and location of element 134 can vary to create a uniform or a non-uniform structure according to the desired process application.

Figure 13:
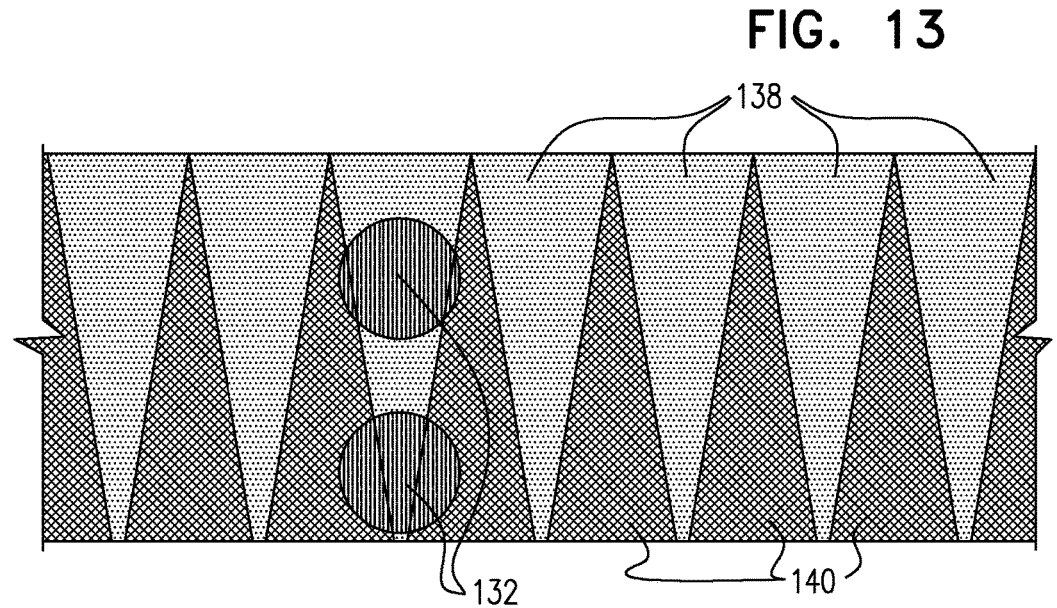
FIG. 13 is a schematic, pictorial detailed illustration showing a top view of a horizontally patterned donor, in accordance with embodiments of the present invention.

FIG. 13 is a schematic, pictorial detailed illustration showing a top view of a horizontally patterned donor with two laser spots 132. The combination of donor's pattern and laser spots are illustrating a controllable material mix in a LIFT process, in accordance with embodiments of the present invention. The donor comprises two elements (alloys, compounds, or pure materials) 138 and 140 which are patterned in a two dimensional (2D) manner on donor's substrate 60.

In an embodiment, the 2D pattern of elements 138 and 140 are in a triangular shape and may be used to create a gradual compositional alloy of elements 138 and 140 were the relative share of each element is defined by the location of the donor, as controlled by control unit 30, with respect to the laser spot. For example, the alloy formed in the top laser spot 132 has a higher share of element 132 while the lower laser spot (element 132) creates a larger share of element 140 in the alloy after the LIFT process.

In an alternative embodiment, the same structure may be used to generate groups of specific mixtures of elements 138 and 140 in specific areas of the acceptor. For example, half of the acceptor may be covered with a 50%/50% mixture of elements 138 and 140 and the other half can be covered with a 90% and 10% mixture of elements 138 and 140 respectively.

Adhesion quality is a known challenge in manufacturing of devices made of thin films, such as electronic devices. Specifically, adhesion issues may occur when depositing a wide variety of metals on common substrates such as glass, polymers (e.g. PET, PEN, PI), or on substrates coated with special layers such as silicon-nitrides, ITO, silicon-oxides, or any other conducting or isolating layers.

For example, copper printing on glass typically requires a thin inter-layer (e.g. Molybdenum) which has good adhesion to glass and improves the adhesion of the entire stack. Another example is copper printing on ITO. Some embodiments overcome the adhesion difficulty by self-alloying such materials to improve the intrinsic adhesion of a bulk layer to the acceptor's surface. This capability may be achieved by a multilayered donor structure which creates an alloy with better adhesion to its predecessor layer on the acceptor.

Adhesion issues are partially due to the alloy composition, and in some cases, also due to transient alloying effects at the acceptor's surface. For example, partially oxidized aluminum forms improved adhesion to AZO and ITO surfaces compared to a fully oxidized aluminum layer. An embodiment can overcome this difficulty by providing a controlled gas environment during the LIFT process.

In some embodiments, the donor films comprise two or more films that are interleaved transversely across the transparent donor substrate. Examples of this technique are shown in FIGS. 11C, and 13. Alternatively, any other suitable form of transverse interleaving can be used.

Figure 14:
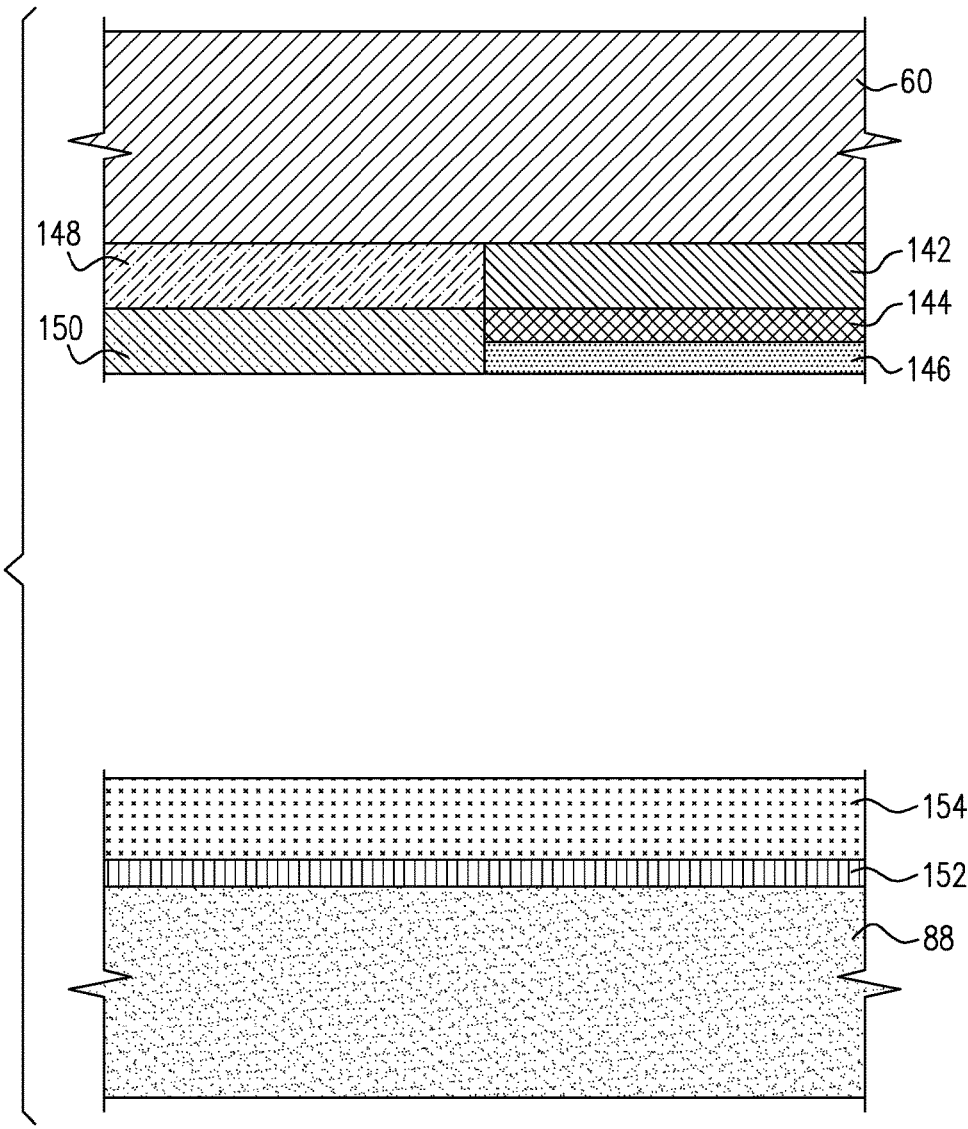
FIG. 14 is a schematic, pictorial side view showing details of a horizontally-divided multilayered structure on a donor, in accordance with embodiments of the present invention.

FIG. 14 is a schematic, sectional view showing details of a horizontally-divided multilayered structure on a donor to form a desired multilayered structure on an acceptor, in accordance with embodiments of the present invention. FIG. 14 comprises layers 142, 144 and 146 which are deposited on the right side of donor's substrate 60 and layers 148 and 150 which are deposited on the left side of the donor's substrate.

In an embodiment, this transversal partitioning of layers may be used for creating a multilayered structure on acceptor's substrate 88 such as layers 152 and 154. In an embodiment, layer 152, which may be an adhesion layer is formed by applying a LIFT process where the laser is pointing only on layers 142, 144 and 146.

Once layer 152 is completed, the laser is shifted to form layer 154, which may be a bulk layer, by processing donor layers 148 and 150. Accordingly, the combination of multiple layers and horizontal patterning of the donor's structure allows users to form complicated structures of multiple layers on the acceptor.

In another embodiment users can print doped dielectrics or doped semiconductors by a donor structure of one or more dielectric or semiconductor layers with thin layers of the doping materials. For example, a multilayered donor stack of one micron total thickness made of thick multiple silicon layers with few embedded interlayers of doping elements such as Boron or Phosphorus. Each doping interlayer is of a few nanometers' thickness.

Composite materials are materials made of two or more component materials with significantly different physical or chemical properties. When these materials are combined, they form a material with characteristics which are different from the individual components. The individual components remain separate and distinct within the finished structure. A Metal Matrix Composite (MMC) is a composite material with at least two constituent parts, one being a metal which is the major part of the composite (known as the matrix). The other material may be a different metal or another material, such as a ceramic or organic compound, which is embedded in the metal matrix. The structure of the embedded elements in the matrix can appear in several forms such as fibers, honeycombs, particles, criss-cross or any other form.

MMC's are made of a wide range of materials and commonly used in a variety of applications.

Figure 15:
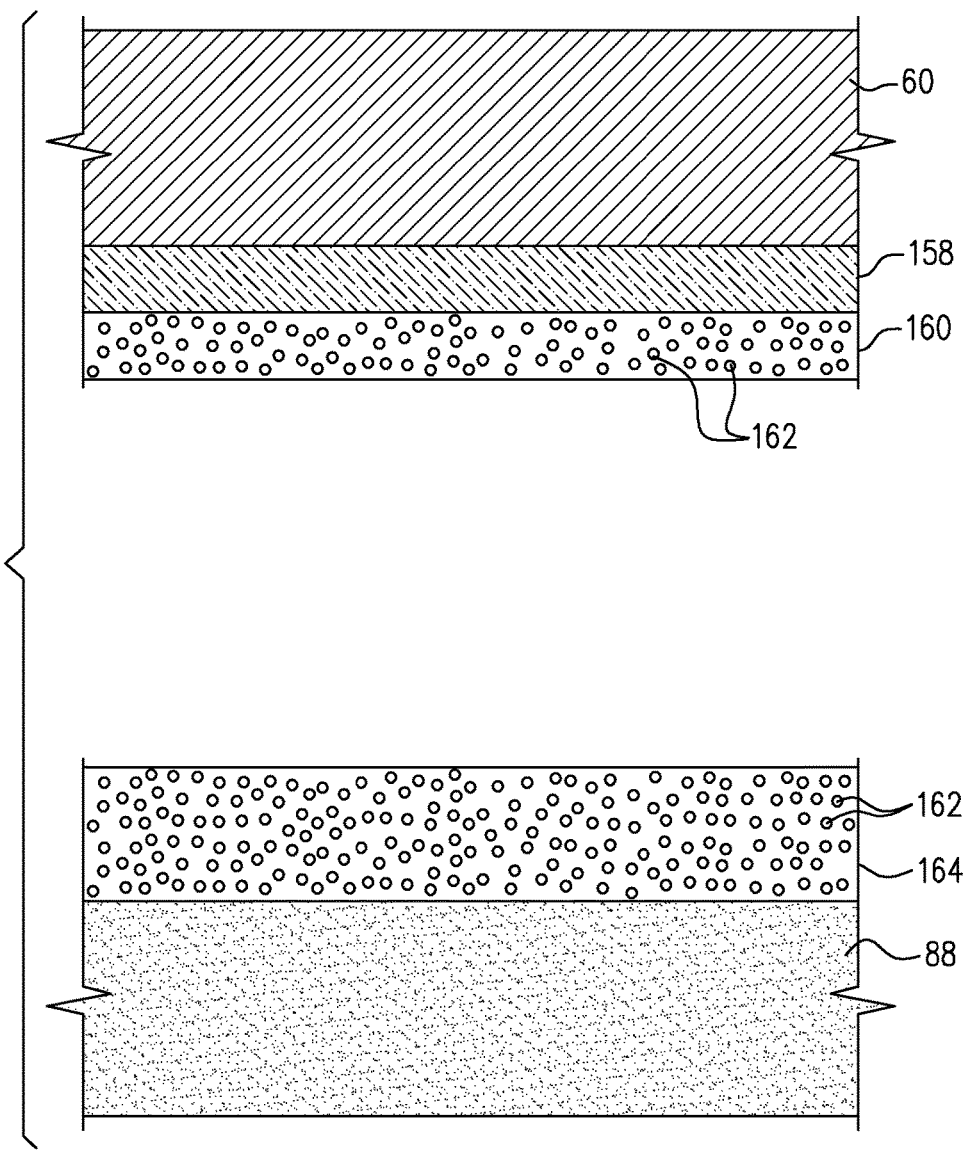
FIG. 15 is a schematic, pictorial side view showing details of a multilayered donor structure with embedded particles, in accordance with embodiments of the present invention.

FIG. 15 is a schematic, pictorial side view showing details of a multilayered donor structure with embedded particles to form a composite matrix structure with embedded particles on an acceptor which is also shown in this figure, in accordance with embodiments of the present invention. Layers 158 and 160 are deposited on donor's substrate 60, and comprise the metal matrix (made by alloying layers 158 and 160) and tiny particles 162 which are embedded in layer 160 of the donor. Layer 164 is deposited on acceptor's substrate 88 and comprises particles 162 which are the second element in the presented composite matrix. As mentioned earlier, particles 162 are made of another metal or a non-metallic material such as dielectric or organic material according to the desired application.

In other embodiments, MMC's are manufactured by depositing multiple layers of different materials. By preparing the layered structures alternating metal and dielectric layers it is possible to obtain controlled metal matrix compositions. For example: $Al/Al_2O_3$ which is a composition of much interest due to its superior mechanical properties. Such MMC's can be formed by aluminum oxidation and a mixing in an oxidizing atmosphere, or in a more controlled manner, by melting an aluminum layer and an oxide layer on the donor and depositing them on the acceptor in a non-oxidizing atmosphere. The matrix composition on the acceptor is defined by the thickness of each layer in the donor.

In other embodiments, a long list of materials are used in MMC's, for example titanium, several types of graphite, compounds such as silicon carbide (SiC), and several types of inter-metallic compounds and nanomaterials such as Carbon Nanotubes (CNT), which are embedded in MMC' s and other composite materials. Examples of other composite materials are Ceramic Matrix Composites (CMC) where the majority of the material (the matrix) is made of a ceramic materials and Polymer Matrix Composites (PMC) where majority of the material is made of a polymer.

Electrets are dielectric materials which have a quasi-permanent embedded electric charge. There are different types of electrets based on Polymers or based on dielectric materials with embedded charged metal particles.

Figure 16:
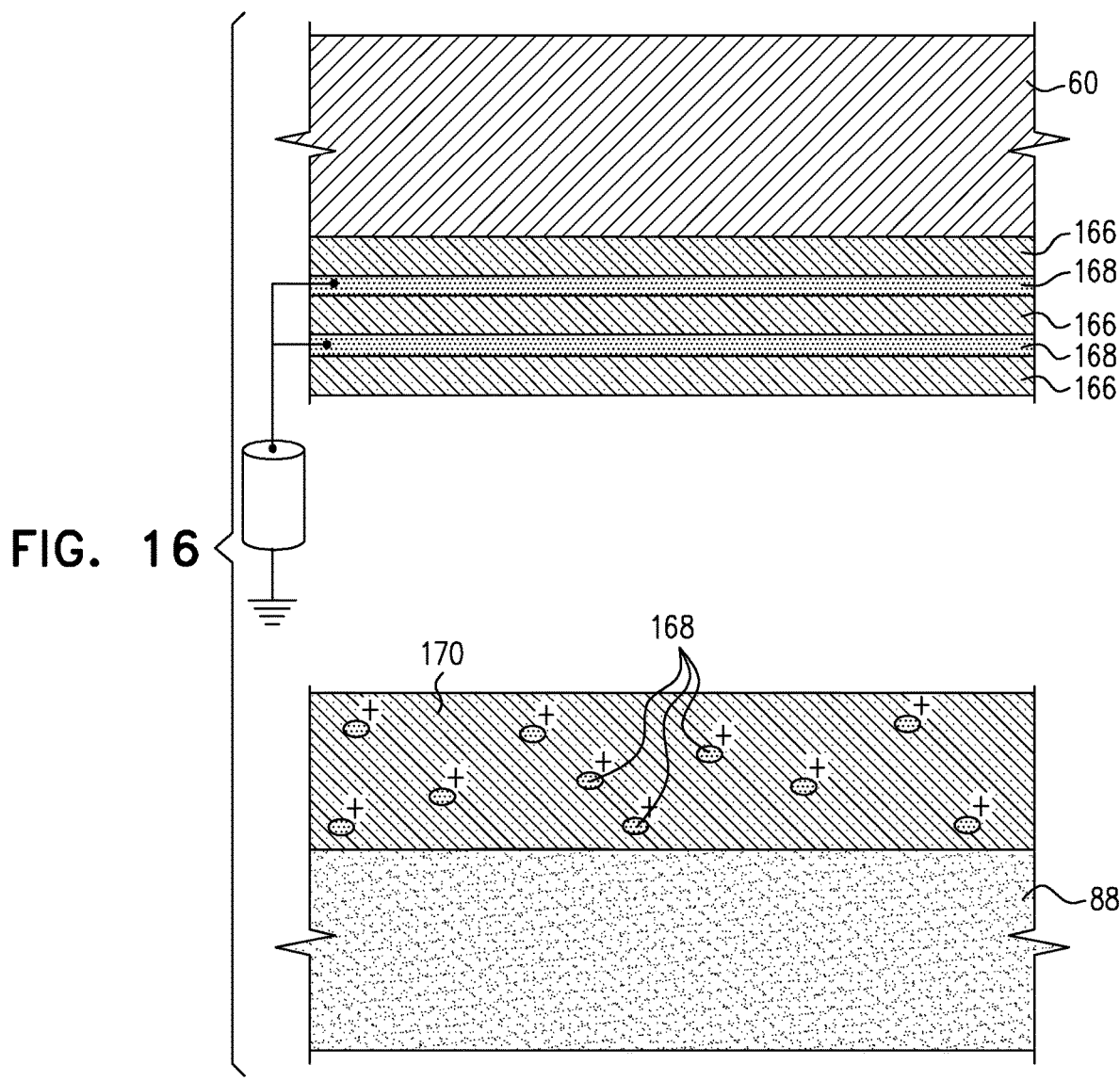
FIG. 16 is a schematic, pictorial side view showing details of a multilayered donor structure with charged selected layers, in accordance with embodiments of the present invention.

FIG. 16 is a schematic, pictorial side view showing details of a multilayered donor structure with charged selected layers to form electrets structure with embedded charged particles on an acceptor, in accordance with embodiments of the present invention. Layer 166 is a dielectric layer and layer 168 is a metal layer. Layers 166 and 168 are alternately deposited on donor's substrate 60 in an ABABA structure where A represents layer 166 and B represents layer 168. The metal layers thus effectively form a capacitor. The metal layers are connected to a power supply (not shown in the figure) that charges the capacitor in a negative or a positive charge according to the relevant application requirement.

After applying a LIFT process on this donor structure, the surface of acceptor's substrate 88 is coated by a layer of electrets. This layer is made of a dielectric matrix 170 (based on layers 166 and additional materials that may be added to the donor's stack) and charged metal particles, which are made of layers 168 in the donor.

In some embodiments, a LIFT process comprising multilayered donor with stacked dielectric layers and charged metal layers is used. The donor's stack structure is described in FIG. 16 and the charge is applied, using the above-described power supply, to the metal layers. During the LIFT process, high-energy laser pulses are impinging on the donor stack to create a spray of a mix between dielectric and charged metal droplets to be ejected from the donor stack and forming electrets.

The formed electrets comprise a dielectric matrix with embedded charged metal particles. In an alternative embodiment, a negative charge on layers 168 creates electrets with a negative charge. In alternative embodiments, the donor's structure can vary from the one presented in FIG. 16 and the charging mechanism may be based on electrostatic charging or other charging methods. In an alternative embodiment, layer 170 may be a polymer and forms by a composition of layers from the donor where layers 166 in FIG. 16 are different kinds of layers which are mixed during a LIFT process to create layer 170.

Figure 17:
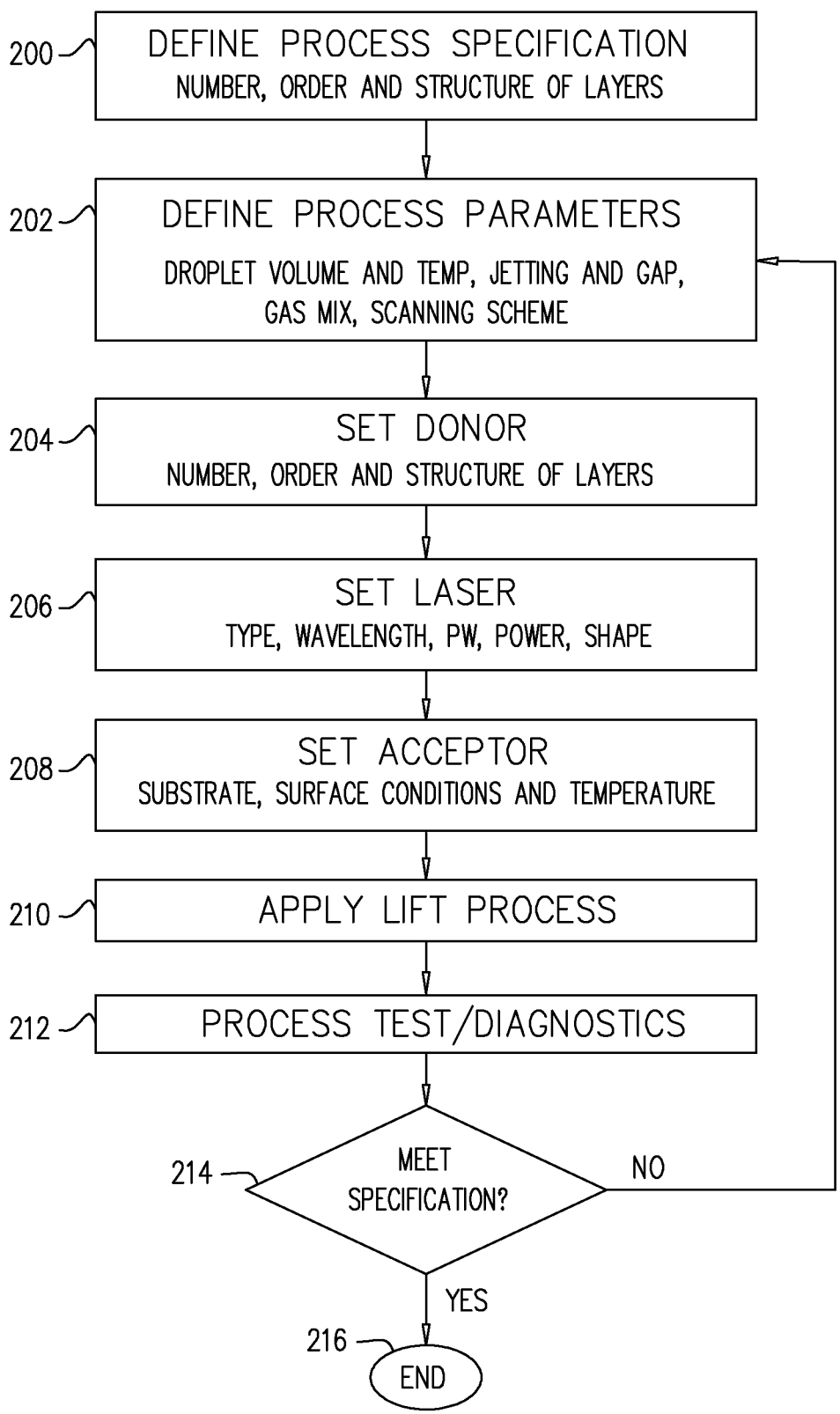
FIG. 17 is a flow chart, which schematically illustrates a LIFT process of a multilayered patterned donor, in accordance with an embodiment of the present invention.

FIG. 17 is a flow chart, which schematically illustrates a LIFT process of a multilayered patterned donor to form a desired complex structure on an acceptor, in accordance with an embodiment of the present invention. The LIFT process is based on the target end-product requirements such as conductivity, mechanical strength, and interface with other devices, industrial standards and more. Material selection and product architecture are derived accordingly and the LIFT process is designed to meet these requirements.

The process begins at a process specification definition step 200, which defines the process specifications of the acceptor, such as number of layers, their order, and structure (e.g., composition and material phase) and thickness of each layer in the final acceptor's stack. At a parameter definition step 202, the users define process parameters such as laser spot size, energy, gap between the donor and the acceptor (typically between 100 microns and 500 microns), atmospheric gas mix in the LIFT process chamber (in case alloying requires specific gas atmospheres), and scanning schemes of the relative motion between the laser, the donor, and the acceptor. Such input parameters later define output parameters such as droplet volume and temperature, and jetting speed from the donor towards the acceptor.

At a donor setting step 204, the users set the donor's structure based on key parameters such as number of layers and their order, and structure (e.g., composition and thickness) of each layer, and other parameters.

At a laser setting step 206, the users set the laser by selecting laser type, wavelength, power, pulse width and other parameters. At an acceptor setting step 208, the users set the acceptor's parameters such as substrate type and thickness, surface conditions, temperature and other parameters.

At a LIFT process step 210, the users apply the LIFT process based on the above settings and steps where the laser ejects micro droplets from the donor, depositing them on the acceptor. At a diagnostic step 212, the users may conduct diagnostic steps in order to test whether the process was according to plan and the outcome on the acceptor meets the target process specifications.

At a decision step 214, the users have to decide, based on the data collected at a diagnostic step 212, if the process meets the specification. If the process meets the predefined specification, the acceptor moves on to the next manufacturing step (i.e., an end step 216). If the process does not meet the predefined specification, the users are restarting the process from a parameter definition step 202 according to the above detailed flow.

In some embodiments the users may conclude that the process specification is not accurate and hence, may decide to redefine the process specification. In such a case, after decision step 214, the flow loops back to process specification definition step 200.

In another embodiment the users may conclude that donor setting was incorrect. In such a case, after decision step 214, the flow loops back to donor setting step 204.

In another embodiment an investigation for an out-of-specification event may point that laser 50 setting was wrong. In such a case, after decision step 214, the flow loops back to laser setting step 206.

In another embodiment the users may conclude that the acceptor setting was wrong. In such a case, after decision step 214, the flow loops back to acceptor setting step 206.

In other embodiments of process not meeting its specification at decision step 214, the users may identify an equipment malfunction although all settings are correct. In such a case, after decision step 214, the flow loops back to LIFT process step 210.

In other embodiments of process not meeting its specification at decision step 214, the users may identify a malfunction of a diagnostics tool at diagnostic step 212. In such a case, after decision step 214, the flow loops back to diagnostic step 212 for repeating diagnostics.

Metallic glasses (amorphous metals) are very attractive materials for many applications in electronic devices such as tunable resistors and packaging materials for mobile electronic devices. Metal-glasses are created by melting metals and cooling the melt extremely fast (in a so-called quenching process) to obtain a quasi-stable amorphous state. In some embodiments many kinds of metallic glasses can be formed by LIFT processes thanks to a quenching process of the micro-droplet at typical cooling rates of $10^{10}$ degrees per second.

Figure 18:
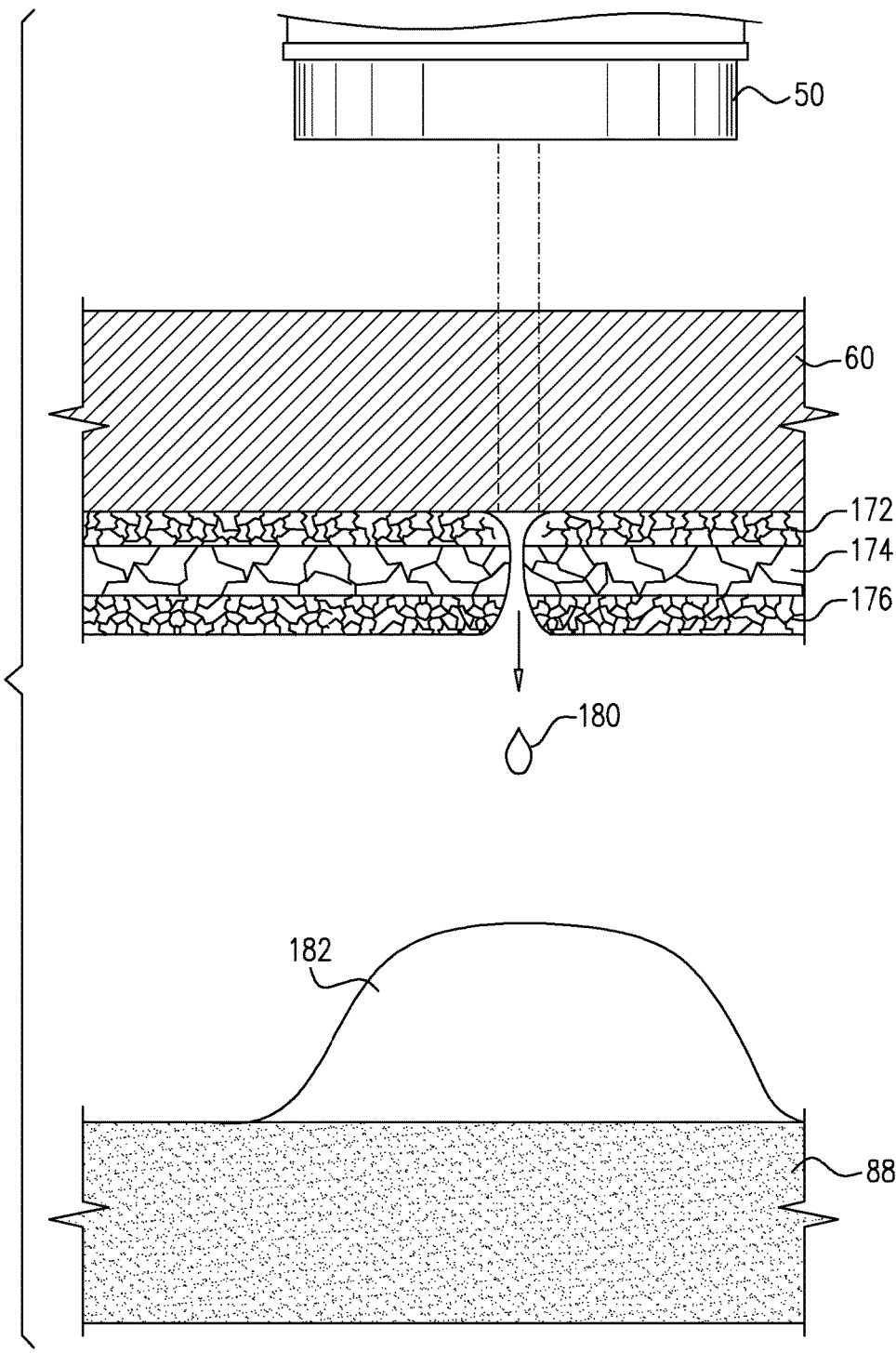
FIGS. 18-21 are schematic, pictorial side views showing details of a donor structure comprising multiple polycrystalline layers, in accordance with embodiments of the present invention.

FIG. 18 is a schematic, pictorial side view showing details of a donor structure comprising multiple polycrystalline layers which forms an amorphous alloy in a so-called metal-glass structure on an acceptor, in accordance with embodiments of the present invention.

Metallic glasses (amorphous metals) are attractive materials for many applications in electronic devices such as tunable resistors and packaging materials for mobile electronic devices. Metal-glasses are created by melting metals and cooling the melt extremely fast (in a so-called quenching process) to obtain a quasi-stable amorphous state. In some embodiments many kinds of metallic glasses can be formed by LIFT processes thanks to a quenching process of the micro-droplet at typical cooling rates of $10^{10}$ degrees per second.

Layers 172, 174 and 176 are polycrystalline metallic layers which are stacked on donor's substrate 60 to form a donor. Following a request from control unit 30, laser 50 points at the donor and ejects a micro droplet 180, which departs from the donor and lands on the acceptor to form layer 182, which is a metal-glass alloy of metallic layers 172, 174 and 176.

In some embodiments the users can create alloys of metal-glass by a combination of a multilayered donor and very fast cooling of droplet 180 on the acceptor. The very high surface-area-to-volume ratio of the micro droplet allows an extremely fast cooling of the alloy in the melt, together with control unit 30, which is typically configured to set accurate temperature and positioning of apparatus 20. Materials tend to have an amorphous structure when they are in a liquid state. By cooling materials in very fast rates, the liquid is "freezing" in an amorphous state and "do not have the time" to develop their typical crystalline structure (window glass is the most common example and it is formed by quenching silicon melts). Fast heat transfer is essential to obtain very fast cooling and a high surface area to volume ratio is a critical parameter. A micro droplet of a metallic alloy, which is formed in a LIFT process has a very high surface-area-to-volume ratio and can be cooled extremely fast to form an amorphous structure of a so-called metal-glass.

In some embodiments the present technique is used to print a bimetal glass. Bimetal glass refers to a glass made of two metals, for example 50% zirconium and 50% copper. In other embodiments the donor's structure comprises multi-component alloys such as germanium-based alloys which require very high cooling rates.

In another embodiment unstable compositions of materials can be formed by LIFT processes which apply fast melting and very high cooling rates.

In other embodiments users may print, by the same technique, non-metallic amorphous alloys such as amorphous semiconductors instead of metal-glasses. This embodiment may be formed by using layers comprising semiconductor materials in the donor. Such semiconducting materials can be doped silicon and germanium, and can be compounds such as indium-antimony (InSb) and gallium-arsenide (GaAs).

An important embodiment is related to advanced display application. In this embodiment oxide glasses such as indium-gallium-zinc-oxide (known as IGZO) may be used to form high mobility transistors. Other embodiments comprise similar materials such as $V_2O_5$—$P_2O_5$, $SiO_x$ and $Al_2O_3$.

Other embodiments are chalcogenide glasses such as $As_{31}Ge_{30}Se_{21}$—$Te_{18}$, cadmium telluride, indium sulfide, zinc telluride and sodium selenide.

Figure 19:
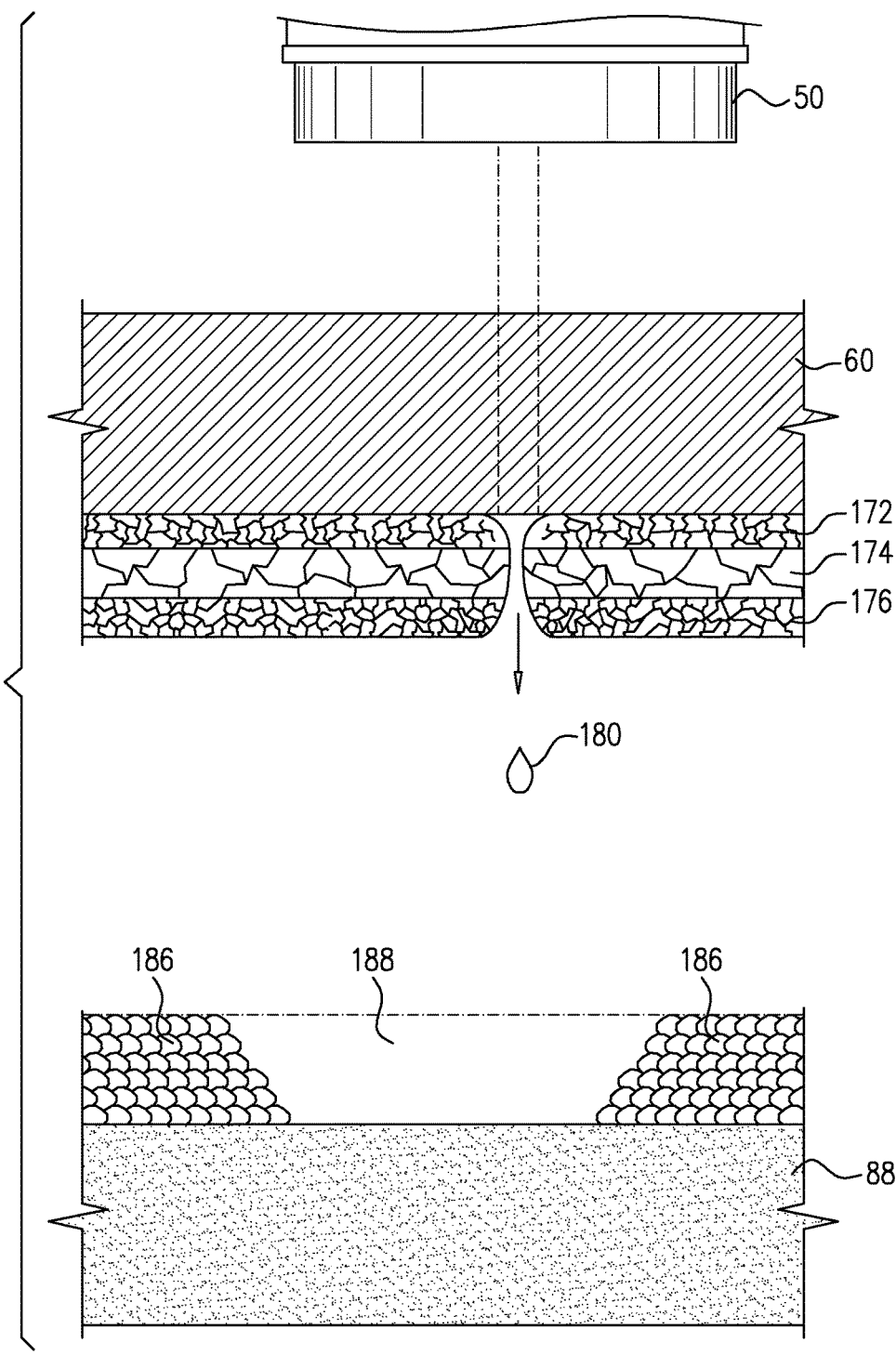

FIG. 19 is a schematic, sectional view showing details of a donor structure comprising multiple polycrystalline layers and an acceptor comprising a mixture of metal-glass and polycrystalline metal in a single layer, in accordance with embodiments of the present invention.

Layers 172, 174 and 176 are stacked polycrystalline metallic layers deposited on donor's substrate 60 to form a donor. Based on a request from control unit 30, laser 50 points at the donor and ejects a micro droplet 180. Micro droplet 180 departs from the donor and lands on the surface of acceptor's substrate 88 to form a layer. The formed layer comprises a mix of a metal-glass alloy 188 and a polycrystalline alloy 186. A mixed structure can be formed by controlling the temperatures of the micro droplet and the acceptor's surface.

In an embodiment, the polycrystalline material is printed on the sides of the acceptor and the metal glass is printed in the center. Such a location-based mixed structure may be formed by controlling the temperatures of the acceptor's surface, by control unit 30, at the location and time of the printing.

Figure 20:
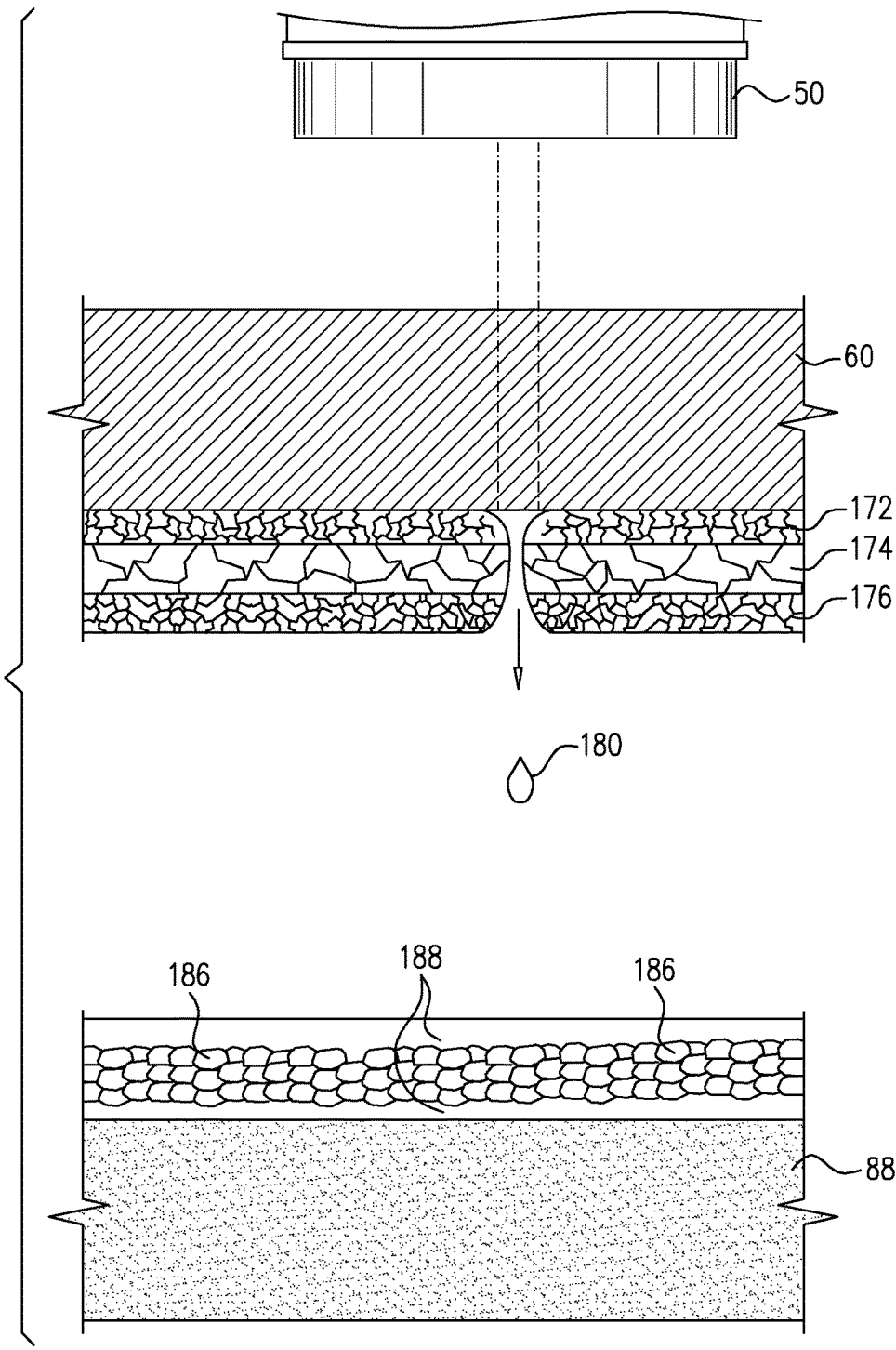

FIG. 20 is a schematic, sectional view showing details of a donor structure comprising multiple polycrystalline layers and an acceptor comprising a mixture of metal-glass and polycrystalline metal in a single layer, in accordance with embodiments of the present invention.

Layers 172, 174 and 176 are stacked polycrystalline metallic layers deposited on donor's substrate 60 to form a donor. Laser 50 points at the donor and ejects a micro droplet 180. Micro droplet 180 departs from the donor and lands on the surface of acceptor's substrate 88 to form a layer. The formed layer comprises a mix of a metal-glass alloy 188 and a polycrystalline alloy 186. In an embodiment, the mixed structure can be formed by controlling the temperatures of the micro droplet and the acceptor's surface.

Metal-glass is formed by fast cooling of the melt while a polycrystalline structure is formed by a slower cooling rate.

In other embodiments, the acceptor's surface temperature, the gap between the donor and acceptor, the air temperature, and the velocity of the ejected micro droplet are used to control the cooling rate and hence, the morphological structure (e.g., amorphous or crystalline) of the printed layer on the acceptor. The above parameters may be controlled, for example, by control unit 30.

In FIG. 20 the mixed layer is structured in three sub-layers forming a sandwich of two metal-glasses 188 and a polycrystalline layer 186 between them, in accordance with embodiments of the present invention.

Figure 21:
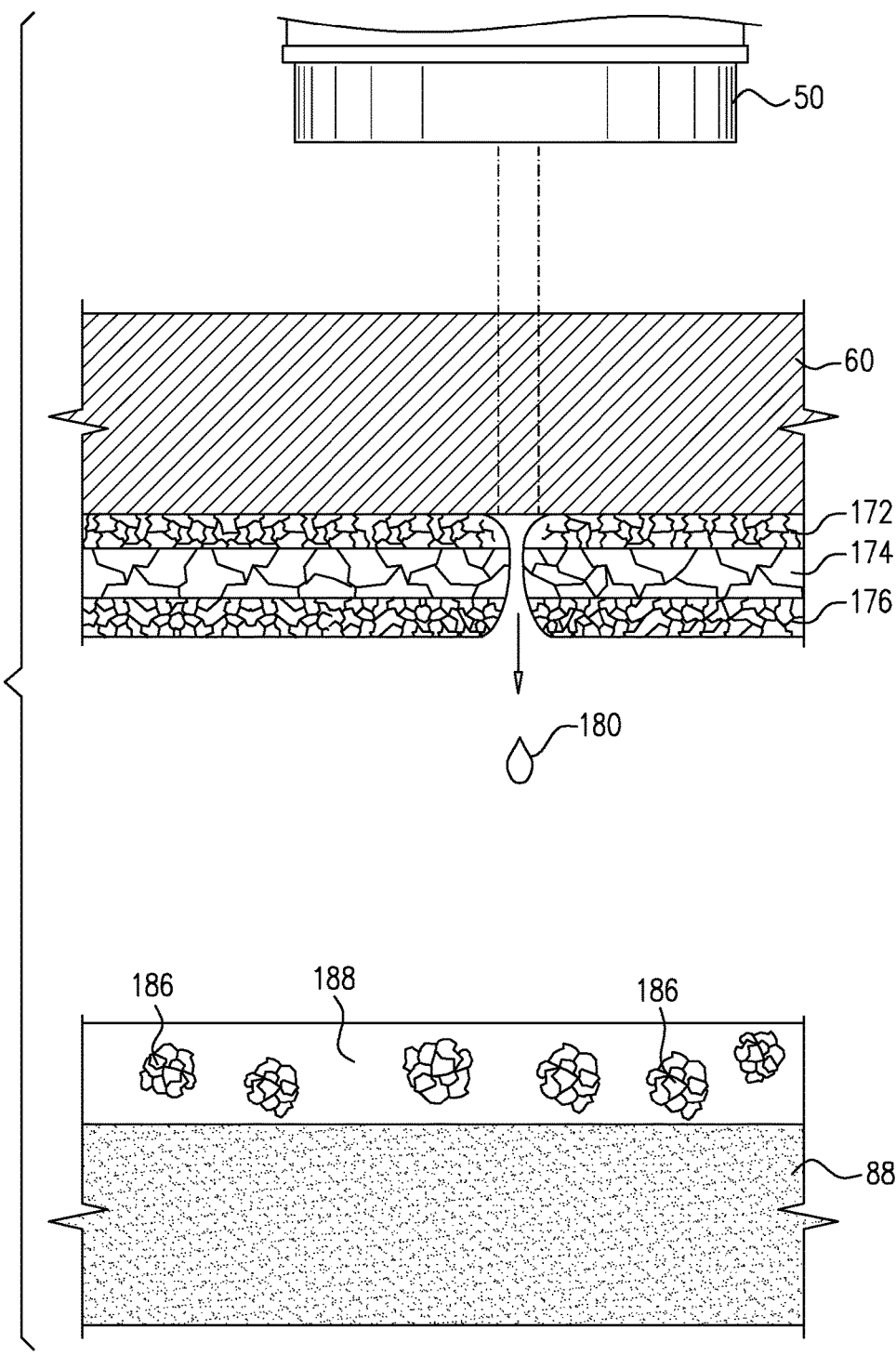

FIG. 21 is a schematic, sectional view showing details of a donor structure comprising multiple polycrystalline layers and an acceptor comprising a mixture of metal-glass and polycrystalline metal in a single layer, in accordance with embodiments of the present invention.

Layers 172, 174 and 176 are stacked polycrystalline metallic layers deposited on donor's substrate 60 to form a donor. Based on a request from control unit 30, laser 50 points at the donor and ejects a micro droplet 180. Micro droplet 180 departs from the donor and lands on the surface of acceptor's substrate 88 to form a layer. The formed layer comprises a mix of a metal-glass alloy 188 and a polycrystalline alloy 186.

In an embodiment, the structure of the printed layer comprises a matrix of the metal-glass alloy with embedded particles of the polycrystalline alloy. As mentioned earlier, droplet temperature and cooling rates, controlled by control unit 30, are defining the formation of alloys 186 and 188.

In some embodiments the users may use graded structures, as shown in FIGS. 6, 7, and 13 to form a mixed structure of metal-glass and polycrystalline metal in non-uniform alloying compositions.

In another embodiment users may apply the donor structure shown in FIG. 14 to create a mixed structure of amorphous and crystalline alloys where each alloy is made of one or more different sets of materials.

Figure 22:
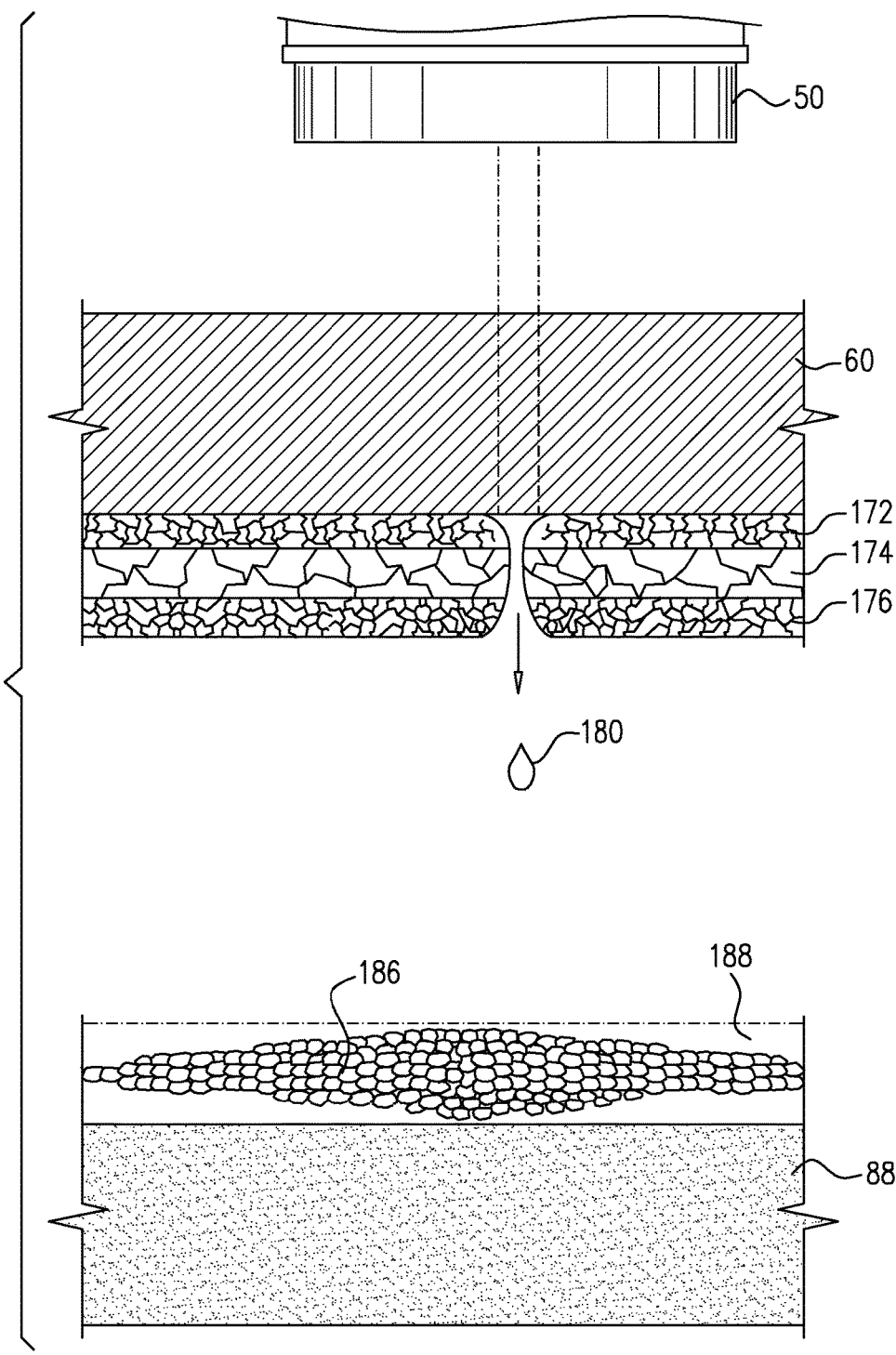
FIG. 22 is a schematic, pictorial side view showing details of a donor structure comprising multiple polycrystalline layers, in accordance with embodiments of the present invention.

FIG. 22 is a schematic, sectional view showing details of a donor structure comprising multiple polycrystalline layers and an acceptor comprising a mixture of metal-glass and polycrystalline metal in a single layer, in accordance with embodiments of the present invention.

Layers 172, 174 and 176 are stacked polycrystalline metallic layers deposited on donor's substrate 60 to form a donor. Based on a request from control unit 30, laser 50 points at the donor and ejects a micro droplet 180. Micro droplet 180 departs from the donor and lands on the temperature-controlled surface of acceptor's substrate 88, at a pertinent location as defined by control unit 30, to form a layer. The formed layer comprises a mix of a metal-glass alloy 188 and a polycrystalline alloy 186.

In an embodiment, the structure of the printed layer comprises a gradual mixture of the metal-glass and the polycrystalline alloys across the acceptor's bulk. The droplet's temperature and cooling rate are typically set by controller 30, and define the formation of alloys 186 and 188.

Figure 23:
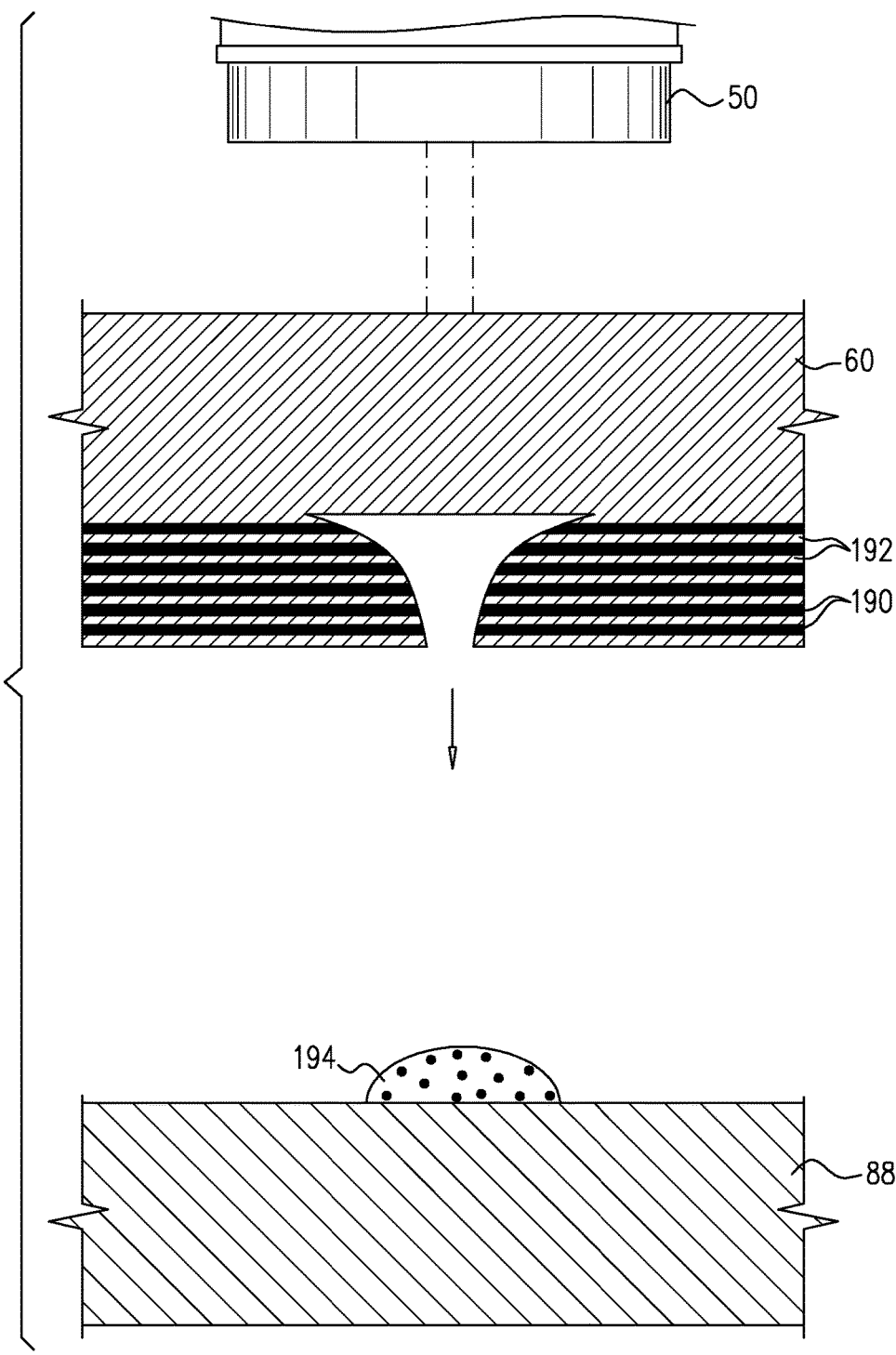
FIG. 23 is a schematic, sectional view showing details of a donor structure comprising a super lattice of multiple semiconductor and dielectric layers and an acceptor comprising a mixture of semiconductor-dielectric in a quantum dot, in accordance with embodiments of the present invention.

FIG. 23 is a schematic, sectional view showing details of a donor structure comprising a super lattice of multiple semiconductor and dielectric layers and an acceptor comprising a mixture of semiconductor-dielectric in a quantum dot, in accordance with embodiments of the present invention.

Layers 190 are typically thin (e.g., few nanometers thickness) semiconductor films, stacked with dielectric layers 192 of nanometer-level or micrometer-level thickness deposited on donor's substrate 60 to form a donor. LIFT transfer with a laser at adequate wavelength forms an inhomogeneous mixing of semiconductor into a dielectric matrix. The semiconductor zone is concentrated to spheres in order to form minimal surface tension, and the size is correlated to the semiconductor thickness in the super lattice. The spheres size of few nanometers form quantum dots encapsulated by a dielectric matrix. The size of the quantum dot is controllable by controlling the thickness of the semiconductor and dielectric layers in the donor.

Other gradual structures may be formed by the same technique in other embodiments of the present invention.

The above embodiments and additional details of the disclosed embodiments may be summarized in the following table, which comprises groups of materials and applications of the multilayered LIFT methods:

| Name/Group | Description/Materials | Usage/Application |
| --- | --- | --- |
| Binary, ternary and quaternary metal alloys | Cu/Ag; Al/Cu; Sn/Ag/Cu and more | Large variety of applications |
| Silicides (a metal-silicon compound) | Intermetallics such as: Conductive: $Cu_5Si$, (V, Cr, Mn)3Si, $Fe_3Si$, $Mn_3Si$, Nonconductive: $(Mg, Ge, Sn, Pb)_2Si$, $(Ca, Ru, Ce, Rh, Ir, Ni)_2Si$ | NiSi - solar barrier; $WSi_2$; conductive ceramic; MEMS, oxidation resistance, microelectronics (contact) |
| ferromagnetics | AlNiCo | Permanent magnets. printed micro-motors and sensors |
| Dielectrics | Strontium-Barium-titanate; Calcium-copper-titanate | High dielectrics constant materials. Serving for capacitors. |
| Glassy metals; metal glasses; amorphous metals | Both special glass (mon and binary alloys which are otherwise difficult to make as glasses (hyper-fast quenching) and otherwise ternary etc and more common metal glasses (e.g., $Ti_{40}Cu_{36}Pd_{14}Zr_{10}$.) | Improved mechanical properties |
| MMC | Metal matrix composites: donor made of metal + a layer of dielectrics or nano-particles or micro-particles | Improved mechanical strength |
| Electrets | Formed by embedding charged particles in the jetted dielectric droplets. | Electrets have a large number of applications |
| Chalcogenide glasses | $V_2O_5$—$P_2O_5$, SiOx and $Al_2O_3$ | |
| Oxide semiconductors | IGZO | Printed transistors |
| Amorphous or crystalline semiconductors | Ge, Si, GaAs | Electronic logic, photo-detection and light emission |

The above table represents examples of materials (compounds, alloys, and pure materials) and usages and applications. In other embodiments there can be additional materials and applications which are relevant to the described techniques of the disclosed invention.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method of material transfer, comprising:
providing a donor substrate, having a first surface and a second surface, wherein the first surface and the second surface are on opposite sides of the donor substrate, and a plurality of donor films is on the second surface, the plurality of donor films comprising at least a first film of a first component and a second film of a second component, different from the first component;
positioning the donor substrate in proximity to an acceptor substrate, with the second surface facing toward the acceptor substrate; and
irradiating the plurality of donor films with pulses of laser radiation transmitted through the first surface of the donor substrate and incident on the plurality of donor films at a location and melting at least a substantial thickness of the plurality of donor films at the location to form a molten droplet and induce ejection of the molten droplet, from the plurality of donor films onto the acceptor substrate, an entire volume of the molten droplet forming a mixture of the first component and the second component;
wherein the irradiating the plurality of donor films comprises controlling relative proportions of the first component and the second component in the molten droplet by selecting the location on the plurality of the donor films on which the pulses are incident.

2. The method according to claim 1, wherein at least one of the plurality of donor films has a thickness that varies over the second surface.

3. The method according to claim 1, wherein the first film and the second film are interleaved transversely across the second surface.

4. The method according to claim 1, wherein the first film and the second film are different with respect to at least one of a size, a shape, a polycrystalline structure and a morphological structure.

5. The method according to claim 1, wherein an entire thickness of the plurality of donor films at the location on the plurality of donor films is melted into the molten droplet.

6. A method of material transfer, comprising:
providing a donor substrate, having a first surface and a second surface, wherein the first surface and the second surface are on opposite sides of the donor substrate, and a plurality of donor films in a non-uniform distribution is on the second surface;
positioning the donor substrate in proximity to an acceptor substrate, with the second surface facing toward the acceptor substrate; and
irradiating the plurality of donor films with pulses of laser radiation transmitted through the first surface of the donor substrate and incident on the plurality of donor films at a location determined based on the non-uniform distribution, and melting at least a substantial thickness of the plurality of donor films to form a molten droplet and induce ejection of the molten droplet from the plurality of donor films onto the acceptor substrate,
wherein the plurality of donor films comprises at least a first film of a first component and a second film of a second component, and wherein the irradiating the plurality of donor films comprises controlling relative proportions of the first component, and the second component in the molten droplet by selecting the location, and
wherein an entire volume of the molten droplet forming a mixture of the first component and the second component.

7. The method according to claim 6, wherein at least one of the plurality of donor films has the thickness that varies over the second surface.

8. The method according to claim 6, wherein the first film and the second film are interleaved transversely across the second surface.

9. The method according to claim 6, wherein the first film and the second film are different with respect to at least one of a size, a shape, a polycrystalline structure and a morphological structure.

10. The method according to claim 6, wherein a thickness of the first film is different from a thickness of the second film.

11. The method according to claim 6, wherein a morphological structure of the first film is different from a morphological structure of the second film.

12. The method according to claim 6, further comprising controlling an amount of laser energy absorbed by the plurality of donor films by choosing an order of the plurality of donor films on the donor substrate.

13. The method according to claim 6, further comprising controlling a deposition rate of the molten droplet onto the acceptor substrate by choosing an order of the plurality of donor films on the donor substrate.

14. The method according to claim 6, wherein at least one of the plurality of donor films comprises a composite matrix.

15. The method according to claim 6, further comprising electrically charging at least one of the plurality of donor films, thereby forming electrets on the acceptor substrate.

16. The method according to claim 6, further comprising forming at least one amorphous layer of molten material on the acceptor substrate by controlling a temperature of the molten droplet.

17. The method according to claim 6, further comprising forming a hybrid structure of a crystalline material and an amorphous material across the acceptor substrate, by controlling a temperature of the molten droplet.

18. The method according to claim 6, wherein, the first film is a semiconductor material and the second film is a dielectric material, and wherein the irradiating the plurality of donor films comprises forming a quantum dot on the acceptor substrate, the quantum dot comprising the semiconductor material and the dielectric material.

19. A method of material transfer, comprising:
specifying a composition to be transferred onto an acceptor substrate;
providing a donor substrate, having a first surface and a second surface, wherein the first surface and the second surface are on opposite sides of the donor substrate, and a plurality of donor films is on the second surface, the plurality of donor films comprising at least a first film of a first component of the specified composition and a second film of a second component, different from the first component, of the specified composition, wherein thicknesses of the plurality of donor films are selected to produce the specified composition;
positioning the donor substrate in proximity to an acceptor substrate, with the second surface facing toward the acceptor substrate; and irradiating the plurality of donor films with pulses of laser radiation transmitted through the first surface of the donor substrate and incident on the plurality of donor films at a location, and melting at least a substantial thickness of the plurality of donor films at the location to form a molten droplet and induce ejection of the molten droplet from the plurality of donor films onto the acceptor substrate, an entire volume of the molten droplet forming a mixture of the specified component.

20. The method according to claim 19 wherein at least one of the plurality of donor films has a thickness that varies over the second surface.

21. The method according to claim 19, wherein the first film and the second film are interleaved transversely across the second surface.

22. The method according to claim 19, further comprising controlling an amount of laser energy absorbed by the plurality of donor films by choosing an order of the plurality of donor films on the donor substrate.

23. The method according to claim 19, further comprising controlling a deposition rate of the molten droplet onto the acceptor substrate by choosing an order of the plurality of donor films on the donor substrate.

24. A method for material deposition, comprising
providing a donor substrate, having a first surface and a second surface, wherein the first surface and the second surface are on opposite sides of the donor substrate, and a plurality of donor films is on the second surface, the plurality of donor films comprising at least a first film of a first metallic element and a second film of a second metallic element, different from the first metallic element,
positioning the donor substrate in proximity to an acceptor substrate, with the second surface facing toward the acceptor substrate; and
irradiating the plurality of donor films with pulses of laser radiation transmitted through the first surface of the donor substrate and incident on the plurality of donor films at a location, and melting at least a substantial thickness of the plurality of donor films at the location to form a molten droplet and induce ejection of the molten droplet from the plurality of donor films onto the acceptor substrate, the molten droplet having a composition and temperature suitable to form an amorphous alloy on the acceptor substrate, an entire volume of the molten droplet forming a mixture,
wherein the irradiating the plurality of donor films further comprises controlling relative proportions of the first metallic element and the second metallic element in the molten droplet by selecting the location on the plurality of donor films on which the pulses are incident.

25. The method according to claim 24, further comprising forming the amorphous alloy by controlling the temperature of the molten droplet.

26. The method according to claim 24, further comprising forming a hybrid structure of a crystalline material and the amorphous alloy across the acceptor substrate, by controlling the temperature of the molten droplet.

27. A method of material transfer, comprising
specifying a composition to be transferred onto an acceptor substrate;
providing a donor substrate, having a first surface and a second surface, wherein the first surface and the second surface are on opposite sides of the donor substrate, and a plurality of donor films is on the second surface, the plurality of donor films comprising at least a first film of a first component of the specified composition and a second film of a second component, different from the first component, of the specified composition;
positioning the donor substrate in proximity to an acceptor substrate, with the second surface facing toward the acceptor substrate; and
irradiating the plurality of donor films with pulses of laser radiation transmitted through the first surface of the donor substrate and incident on the plurality of donor films at a location, and melting at least a substantial thickness of the plurality of donor films at the location to form a molten droplet and induce ejection of the molten droplet from the plurality of donor films onto the acceptor substrate, an entire volume of the molten droplet forming a mixture of the specified component.

28. The method according to claim 27, wherein the first film comprises a first matrix composite structure configured to form a second matrix composite structure on the acceptor substrate.

29. The method according to claim 27, wherein at least one of the plurality of donor films is charged, such that the ejection of the molten droplet onto the acceptor substrate forms electrets on the acceptor substrate.

* * * * *